US012783026B2

(12) United States Patent
Schanz et al.

(10) Patent No.: US 12,783,026 B2
(45) **Date of Patent: *Nov. 3, 2026**

(54) SHARED CONDUCTORS FOR BIDIRECTIONAL SIGNALS

(71) Applicant: Microsoft Technology Licensing, LLC, Redmond, WA (US)

(72) Inventors: Benjamin Eng Schanz, Redmond, WA (US); Garrett Douglas Blankenburg, Sammamish, WA (US); Keegan Daniel Griffee, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 247 days.

This patent is subject to a terminal disclaimer.

(21) Appl. No.: 18/409,654

(22) Filed: Jan. 10, 2024

(65) Prior Publication Data

US 2025/0224784 A1 Jul. 10, 2025

(51) Int. Cl.
*G06F 1/20* (2006.01)
*G06F 1/12* (2006.01)
(Continued)

(52) U.S. Cl.
CPC .................. *G06F 1/20* (2013.01); *G06F 1/12* (2013.01); *H05B 47/16* (2020.01); *H05K 7/20136* (2013.01); *H05K 7/20209* (2013.01)

(58) Field of Classification Search
CPC .. G06F 1/20; G06F 1/12; H05B 47/16; H05K 7/20136; H05K 7/20209
See application file for complete search history.

(56) References Cited

U.S. PATENT DOCUMENTS 5,736,965 A * 4/1998 Mosebrook ............ H01Q 1/007 343/702
7,038,402 B1 5/2006 Adler
(Continued)

FOREIGN PATENT DOCUMENTS

CN 102016751 A 4/2011
CN 112416447 A 2/2021
(Continued)

OTHER PUBLICATIONS

"Three-Phase Sensorless Fan Driver IC", Retrieved From: https://www.mouser.com/datasheet/2/1115/A5931_Datasheet-3168742.pdf, Nov. 29, 2021, pp. 1-27.
(Continued)

*Primary Examiner* — Gertrude Arthur Jeanglaude
(74) *Attorney, Agent, or Firm* — Alleman Hall LLP

(57) ABSTRACT

A method for operating a computer system comprises transmitting first and second signals between a device interface and a first device over an elongate first conductor, the second signal including content of higher frequency than the first signal; transmitting a timing signal over an elongate second conductor, between a device interface and the first device, for synchronizing the second signal; and exposing at least the second signal and the timing signal to a second device distinct from the first device, the first device being substantially non-responsive to the second signal and to the timing signal, wherein at least the first or second elongate conductor conducts bidirectionally between the device interface and the first device.

20 Claims, 13 Drawing Sheets

(51) Int. Cl.

| | |
|---|---|
| ***H05B 47/16*** | (2020.01) |
| ***H05K 7/20*** | (2006.01) |

(56) References Cited

U.S. PATENT DOCUMENTS

| | | | | |
|---|---|---|---|---|
| 7,141,950 | B1 | 11/2006 | Verge | |
| 7,973,647 | B2 * | 7/2011 | Elberbaum | G08C 17/02 340/13.24 |
| 10,729,011 | B2 | 7/2020 | Carel | |
| 11,474,578 | B2 | 10/2022 | Campbell | |
| 2010/0215509 | A1 | 8/2010 | Krishnamoorthy | |
| 2010/0332983 | A1 | 12/2010 | Evans | |
| 2014/0184097 | A1 * | 7/2014 | Luk | H05B 47/184 315/297 |
| 2015/0214977 | A1 | 7/2015 | De Marco | |
| 2017/0188438 | A1 * | 6/2017 | Vollmer | F21V 5/007 |
| 2018/0192493 | A1 | 7/2018 | Kinstle, III | |
| 2018/0341297 | A1 | 11/2018 | Kinstle, III | |
| 2019/0354502 | A1 | 11/2019 | Ben-Chen | |
| 2020/0077519 | A1 | 3/2020 | Carel | |
| 2020/0337137 | A1 * | 10/2020 | Movahed | H05B 47/10 |
| 2020/0375541 | A1 * | 12/2020 | Shachar | A61B 5/7435 |
| 2022/0163933 | A1 | 5/2022 | Lambert | |
| 2022/0312573 | A1 | 9/2022 | Tan | |
| 2025/0226625 | A1 | 7/2025 | Griffee | |

FOREIGN PATENT DOCUMENTS

| | | | |
|---|---|---|---|
| WO | 2010132938 | A1 | 11/2010 |
| WO | 2022153025 | A1 | 7/2022 |

OTHER PUBLICATIONS

International Search Report and Written Opinion received for PCT Application No. PCT/US2024/059262, Mar. 18, 2025, 11 pages.

Extended European Search Report Received in European Patent Application No. 25150360.3 mailed on Jun. 13, 2025, 09 pages.

“Flat Flex”, Flexible Circuit, Retrieved from URL: flexiblecircuit.com, 2026, 09 pages.

“Universal Serial Bus Specification—Revision 2.0”, Apr. 27, 2000, 08 pages.

C.T. Nadovich, “Chapter 2—Synthetic Instruments—Concepts and Applications”, Elsevier, 2005, 16 pages.

Hsu, Issac, “Driving LEDs with Both Analog and PWM Dimming—Technical Article” Oct. 2015, 03 pages.

Non-Final Office Action mailed on Mar. 4, 2026, in U.S. Appl. No. 18/409,616, 30 pages.

Final Office Action mailed on Aug. 3, 2026, in U.S. Appl. No. 18/409,616, 26 Pages.

International Preliminary Report on Patentability (Chapter I) received for PCT Application No. PCT/US2024/059262 mailed on Jul. 23, 2026, 06 Pages.

* cited by examiner

SHARED CONDUCTORS FOR BIDIRECTIONAL SIGNALS

BACKGROUND

In recent years the chassis dimensions of personal computers, game consoles, and other consumer devices have become increasingly compact, along with the functional componentry inside the chassis. Despite the many advantages of reduced physical size, the assembly and interconnection of compact electronic components can present a challenge in manufacture, which may affect cost.

SUMMARY

One aspect of this disclosure relates to a method for operating a computer system. The method comprises transmitting first and second signals between a device interface and a first device over an elongate conductor, the second signal including content of higher frequency relative to the first signal. The method further comprises exposing at least the second signal to a second device distinct from the first device, the first device being substantially non-responsive to the second signal.

Another aspect of this disclosure relates to a computer system comprising an elongate conductor, a fan controller, and a fan device. The fan controller is coupled to the elongate conductor and configured to: (i) transmit a fan-control signal over the elongate conductor, and (ii) transmit a lighting-control signal over the elongate conductor, the lighting-control signal including content of higher frequency relative to the fan-control signal. The fan device is coupled to the elongate conductor and configured to expose at least the lighting-control signal to a lighting device distinct from the fan device, the fan device being substantially non-responsive to the lighting-control signal. Moreover, in at least some implementations the lighting device is substantially non-responsive to the fan-control signal.

Another aspect of this disclosure relates to a method for operating a computer system. The method comprises transmitting first and second signals between a device interface and a first device over an elongate first conductor, the second signal including content of higher frequency relative to the first signal. The method further comprises transmitting a timing signal for synchronizing the second signal. The timing signal is transmitted between a device interface and the first device over an elongate second conductor, and at least the second signal and the timing signal are exposed to a second device distinct from the first device. In this method the first device is substantially non-responsive to the second signal and to the timing signal, and at least the first or second elongate conductor conducts bidirectionally between the device interface and the first device.

Yet another aspect of this disclosure relates to a computer system comprising an elongate first conductor, a fan controller, a fan device, and a lighting device distinct from the fan device. The fan controller is coupled to the elongate first conductor and configured to: (i) transmit a fan-control signal over the elongate first conductor, and (ii) transmit a lighting-control signal over the elongate first conductor, the lighting-control signal including content of higher frequency relative to the fan-control signal, and (iii) transmit a lighting-clock signal for synchronizing the lighting-control signal. The lighting-clock signal is transmitted over an elongate second conductor. The fan device is coupled to the elongate first and second conductors and is substantially non-responsive to the lighting-control signal and to the lighting-clock signal. At least the lighting-control signal and the lighting-clock signal are exposed to the lighting device, and at least the first or second elongate conductor conducts bidirectionally between the fan controller and the fan device.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any disadvantages noted in any part of this disclosure.

DETAILED DESCRIPTION

Figure 1A:
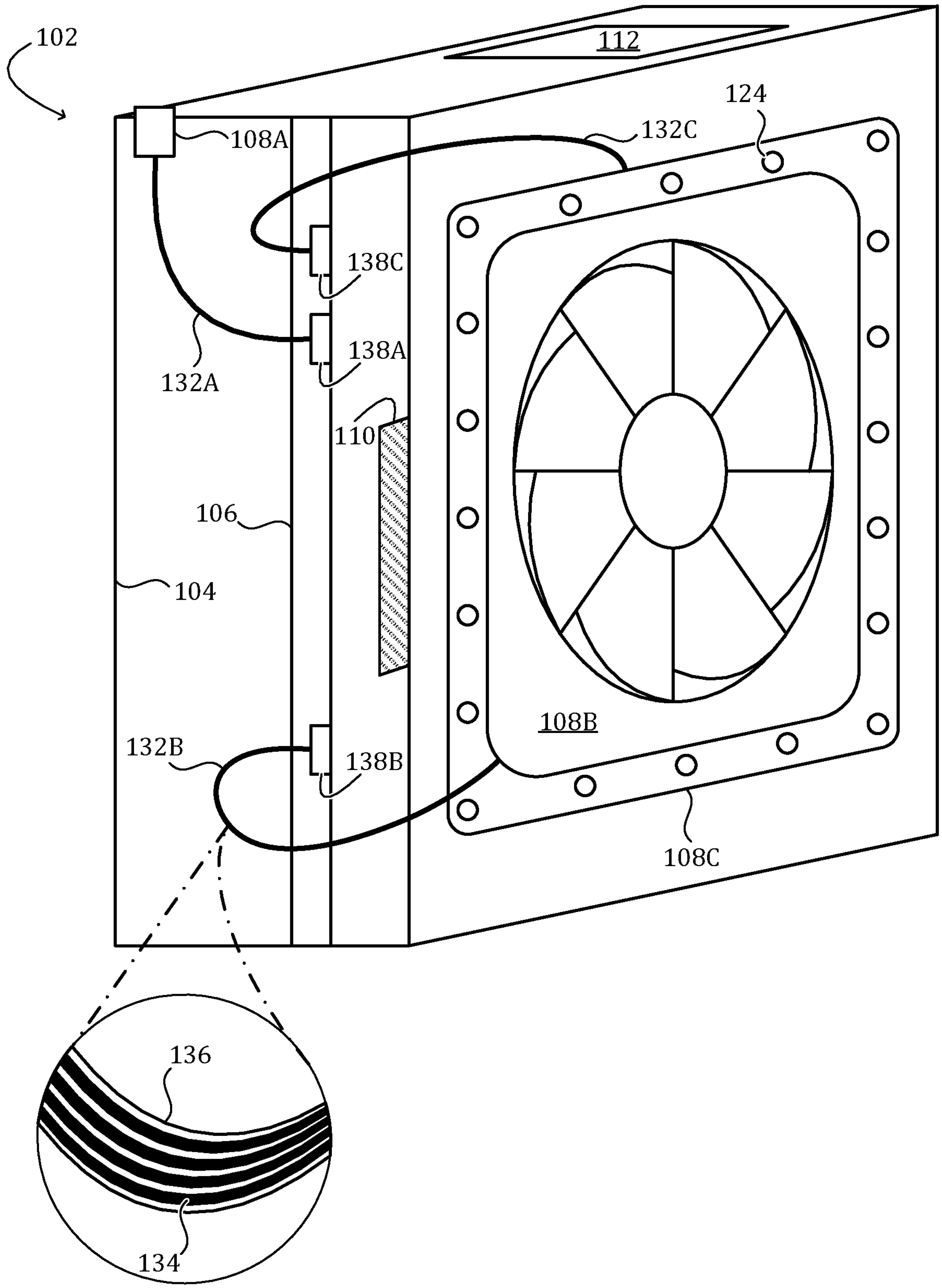
FIG. 1A shows aspects of an example computer system.

This disclosure presents example technology for linking various internal devices of a computer system to a motherboard (i.e., main circuit board) of the computer system. Such internal devices may include, for example, power switches, cooling devices such as fans, and lighting devices that change color or intensity to indicate a changing operational state of the computer system. In state-of-the-art configurations, a dedicated microbus connector runs between each internal device and the motherboard, each microbus including one or more dedicated lines or wires. Typically the motherboard must provide a separate interface element for each of the microbus connectors. As the number of internal devices increases, so too does the complexity of manufacture of the computer system.

The technology herein addresses the above issues by making some of the conductors serve ‘double duty’, carrying sensory or control signals concurrently to more than one internal device, and/or opportunistically changing the direction in which signals are sent. This tactic enables reduction in pin counts, removal of connectors, and corresponding reduction of circuit-board area and trace routing. These and other technical effects of the technology allow smaller circuit boards with simplified connectivity. In some examples a lower-frequency protocol output pin, chosen for its ability to tolerate higher-frequency ‘noise’, is used also to support a higher-frequency protocol output to an entirely different device.

In some examples a pin originally intended to carry only a lower-frequency pulse-width modulated (PWM) output signal for a fan device may also be used to drive a red-green-blue (RGB) lighting device via the higher-frequency (serial or WS281x protocol). In another variant a pin originally dedicated to a relatively low-frequency input signal, such as the tachometer (TACH) line of a fan device, may be used also to carry a timing signal in the opposite direction (from the motherboard to one or more downstream devices). The timing signal can be used to support two-wire and other synchronous, higher-frequency communication protocols, such as I2C (from Phillips Semiconductors).

The solutions herein can provide robust forward and backward compatibility, as the lower-frequency protocols do not necessarily require the presence of the higher-frequency signal for basic operation, but may be chosen judiciously to tolerate the higher-frequency signal, whether or not any downstream device makes use of it.

Turning now to the drawings, FIG. 1 shows aspects of an example computer system 102. The computer system as illustrated is a tower-style desktop computer system. That aspect is not strictly necessary, however, as this disclosure is equally applicable to desktop computer systems of other configurations, to laptop computer systems, game systems, and other suitable computing systems. In the illustrated example chassis 104 of computer system 102 is open, revealing motherboard 106 and a plurality of internal devices 108. Such devices include power switch 108A, fan device 108B, and lighting device 108C.

The arrangement of fan device 108B may differ from one example to the next. In some examples, the fan device is configured to cool a particular heat-making locus of motherboard 106, such as microprocessor 110. The fan device may be proximate to the processor, accordingly. In other examples the fan device is configured to cool a graphics processing unit (GPU, not shown in the drawings), which may or may not be located on the motherboard. In still other examples, the fan device is configured to provide a diffuse cooling flow through a vent 112 in chassis 104 and over any, some, or all of the computer components therein.

Figure 1B:
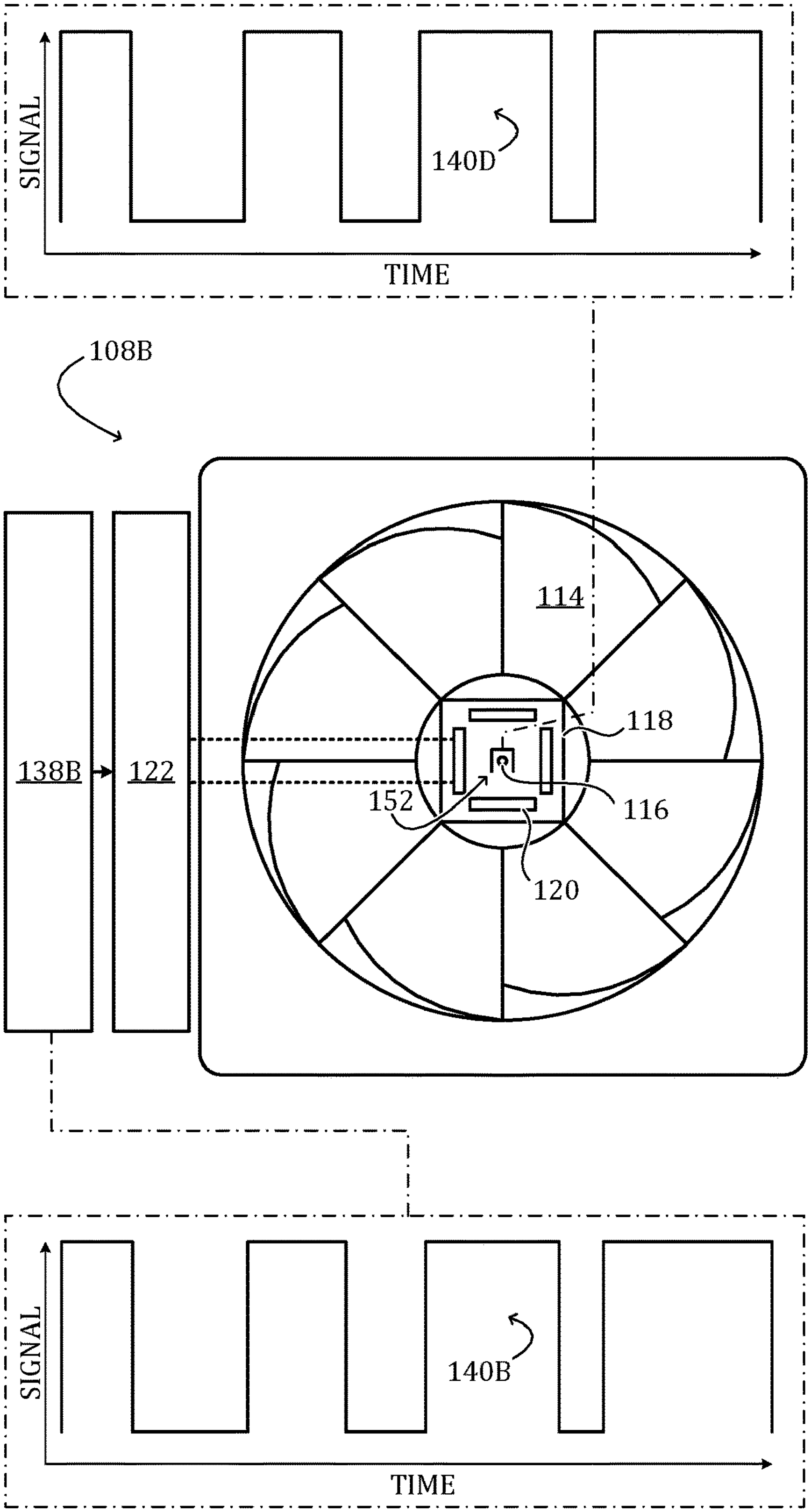
FIG. 1B shows aspects of an example fan device of a computer system.

FIG. 1B shows additional aspects of fan device 108B in one, non-limiting example. Irrespective of its location in computer system 102, fan device 108 includes a bladed impeller 114 coupled to a rotor 116, which is coupled rotationally to an electric motor 118. The electric motor may be a brushless motor driven via electromagnetic induction from stator coils 120. The number of stator coils is not particularly limited. Each stator coil is coupled operatively to drive circuit 122, which drives synchronous electric current through each stator coil so as to rotate the rotor. The drive circuit may receive a variable control signal of any suitable kind—e.g., a PWM control signal.

Figure 1C:
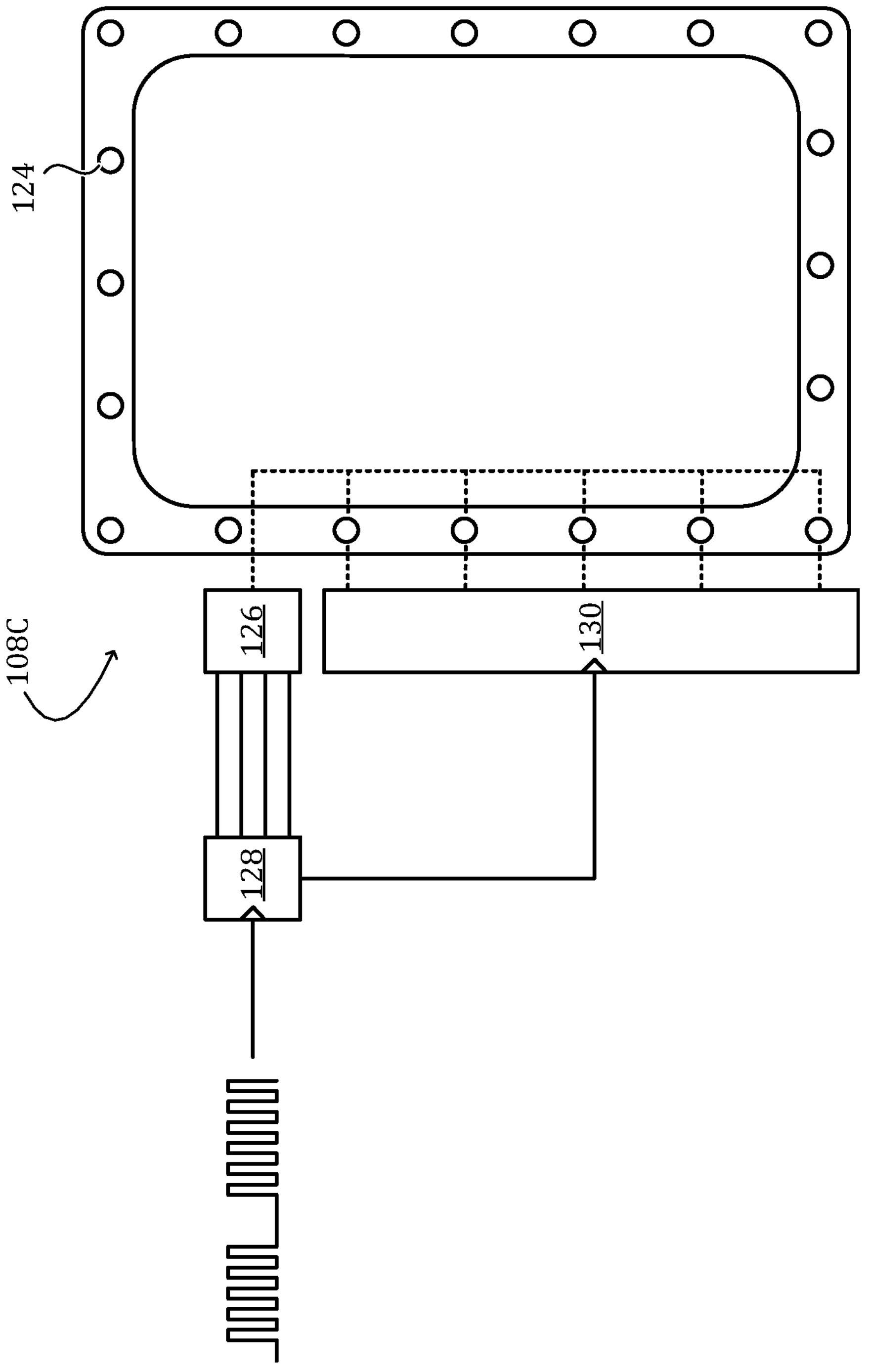
FIG. 1C shows aspects of an example lighting device of a computer system.

Lighting device 108C, like fan device 108B, may differ in the different embodiments of this disclosure. FIGS. 1A and 1C show the lighting device in one, non-limiting example. Generally speaking, the lighting device includes one or more lamps 124 whose visible emission may report on the operation of computer system 102. In the most basic example, the lighting device includes one monochromatic lamp that emits light only when computer system 102, or some component thereof (e.g., a hard disk drive or internet connection) is active. However, this disclosure also contemplates various, more complex lighting devices with plural monochromatic and/or polychromatic lamps. In some examples each monochromatic lamp comprises one or more light-emitting diodes (LEDs) of a suitably narrow emission band as to be perceived as a single color—e.g., red, green, blue, or violet. In some examples each polychromatic lamp comprises two or more LEDs of different, suitably narrow emission bands. Typically the LEDs of the different emission bands are independently addressable—having a common cathode but distinct anodes, or vice versa. In some examples a laser diode or retro-looking micro-grid fluorescent or neon lamp may be used in lieu of an LED in a monochromatic or polychromatic lamp. In some examples diffractive optics may be provided optically downstream of a lamp to produce desired optical effects.

In examples in which lighting device 108C includes a plurality of lamps 124, such lamps may be arranged in a pattern, such as a geometric or grid pattern. In the example shown in FIG. 1A, twenty polychromatic lamps encircle impeller 114 of a microprocessor-cooling fan device 108B of computer system 102. The fan device and lighting device may be proximate, accordingly. In some examples, the plurality of lamps may be set behind an optically diffusive screen (not shown in the drawings) which obscures the appearance of the lamps themselves but transmits the emission thereof.

In some examples, the emission of any, some, or all of the lamps 124, or the coloration thereof, maybe responsive to one or more conditions of computer system 102. Such conditions may include a hardware condition, such as hard disk-drive operation, internet connectivity, etc., or responsive to a software condition. The software condition may include, for example, the disposition of a player in a video game. In one non-limiting example, one or more lamps may emit green light in proportion to the achievements that a player accumulates in a game, and red light in proportion to the danger or loss that the player is experiencing in the game.

In the example illustrated in FIG. 1C, the input to lighting device 108C is a serial input. Each monochromatic lamp or monochromatic component of a polychromatic lamp is driven by a digital-to-analog converter (DAC) 126, which receives the desired intensity of that lamp in the form of a digital signal from serial-in-parallel-out shift register 128. In this example, the carry output of shift register 128 provides the clock input to a D-type shift register 130. With every clock pulse the D-type shift register cycles a unique, preset (e.g., low) bit through the interconnected flip-flops of shift register 130. The parallel output of shift register 130 is applied in common to the cathodes of the array of lamps 124, so as to select which lamp receives the analog drive current. Taken together shift registers 128 and 130 fully demultiplex the serial input signal. In some examples the serial input defines a time-resolved sequence of static states or frames of lighting device 108C. In this manner, appropriate time-resolved lighting is provided, subject to changing hardware and software conditions in computer system 102.

Returning now to FIG. 1A, power switch 108A, fan device 108B, and lighting device 108C are each connected to motherboard 106 via a dedicated, respective microbus 132 (e.g., 132A, 132B, 132C), each microbus comprising a plurality of elongate conductors 134. In some examples one or more of the elongate conductors may comprise an ordinary insulated wire. In some examples one or more of the elongate conductors may comprise a flexible conductive film printed on or otherwise applied on a flexible dielectric film 136. Irrespective of the physical form of the elongate conductors 134, it is evident that increasing the number of microbusses 132 or the number of conductors 134 within any microbus clutters the interior of the computer system and increases the complexity of manufacture of the computer system. Moreover, it is often the case, as shown in FIG. 1A, that each microbus 132 couples to motherboard 106 via a dedicated, respective device interface 138 (e.g., 138A, 138B, 138C), such as a general-purpose input-output (GPIO) microcontroller interface. As the number of device interfaces increases, so too does the complexity of manufacturing the computer system.

It may be possible to reduce the numbers of microbusses 132, conductors 134, and device interfaces 138 by exchanging multiplexed signals over a reduced number of multipurpose microbusses and conductors. In other words, a tree of microbusses could be replaced by a single microbus of reduced conductor count, which threads through a plurality of devices 108. In that solution, however, each device interface 138 on motherboard 106 would be tasked with complex multiplexing and/or demultiplexing operations. In addition, the devices themselves would require complex demultiplexing and pass-thru functionality. For instance, it may be necessary to configure every threaded device with logic appropriate for executing a serial protocol, such as an I2C protocol. That solution is a bar to backward compatibility for relatively simple device types, such as fans and power switches; it also makes it harder to ensure forward compatibility for devices yet to be engineered.

The solutions herein avoid the issues noted above by recognizing that every output device of a computer system has a characteristic response function, and every input device has a characteristic bandwidth. Each response function and bandwidth is characterized by a frequency spectrum, and the frequency spectra may differ, generally, across the range of devices in the computer system. Differences in the frequency spectra across the interconnected devices of a computer system can be exploited to permit exchange of signal between the motherboard and the various devices along shared conductors. In this disclosure a signal transmitted from a device interface and configured to control a device herein is a 'control signal'; a signal transmitted to a device interface from a device herein is a 'sensory signal'; and a signal usable for providing synchronization for any control or sensory signal, irrespective of the direction of transmission, is a 'timing signal'. In examples in which a device interface emits one or more control signals, that device can be called a 'device controller'.

Continuing in FIG. 1A, fan device 108B and lighting device 108C are controlled via respective GPIO microcontroller interfaces 138B and 138C. The manner in which the device interfaces exert such control is not particularly limited. In some examples at least the fan device is controlled via pulse-width modulation (PWM). In this method, shown in FIG. 1B, fan controller 138B transmits to drive circuit 122 a fan-control signal 140B—i.e., a pulse train of fixed-period waveforms, where the width of the pulse within each waveform controls (e.g., is proportional to) the rotational energy imparted to the fan rotor during the fixed period. Due to the inertia of the fan rotor, modulation frequencies (the reciprocal of the fixed period) above 30 kHz are not useful for varying the fan speed. In some examples lighting device 108C is also controlled via a pulse train. In that case, modulation frequencies greater than 23 Hz are, for a single lamp and color, unnoticeable due to the persistence of human vision. For these reasons, Fourier components >30 kHz have no kinematic effect on the fan speed, and Fourier components >23*M*N Hz (Hertz, where M is the number of colors and N is the number of lamps) have no perceivable effect on the lighting.

Figure 2A:
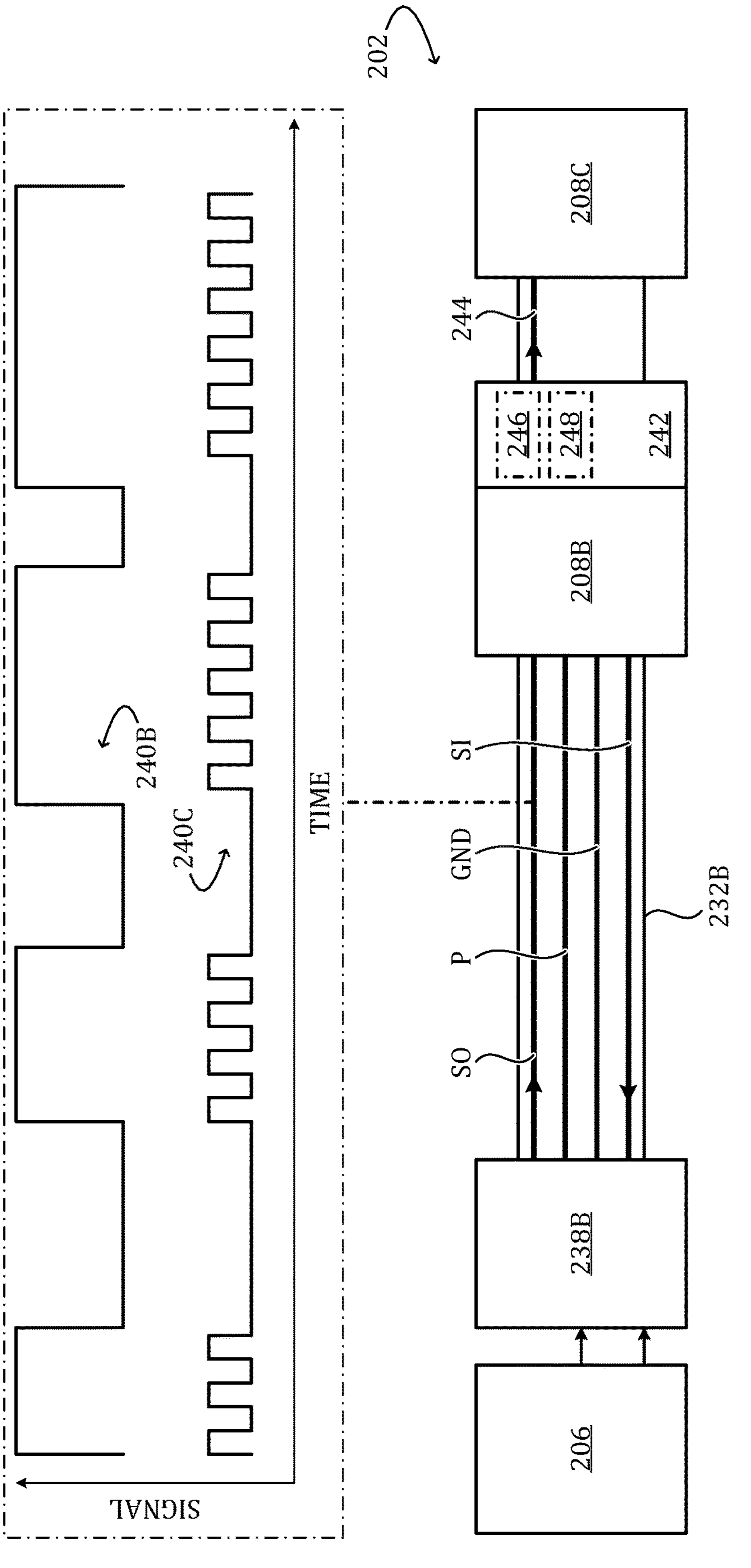
FIG. 2A shows aspects of another example computer system.

In view of the context above, FIG. 2A shows aspects of another computer system 202 comprising a microbus 232B with a plurality of elongate conductors. The conductors are labeled P for power, GND for ground, SO for signal output, and SI for signal input. A device interface in the form of fan controller 238B is coupled to motherboard 206 and to each of the conductors. The fan controller is configured to transmit a first signal in the form of fan-control signal 240B over conductor SO. Fan controller 238B is also configured to transmit a second signal in the form of lighting-control signal 240C over the same conductor SO.

Figure 2B:
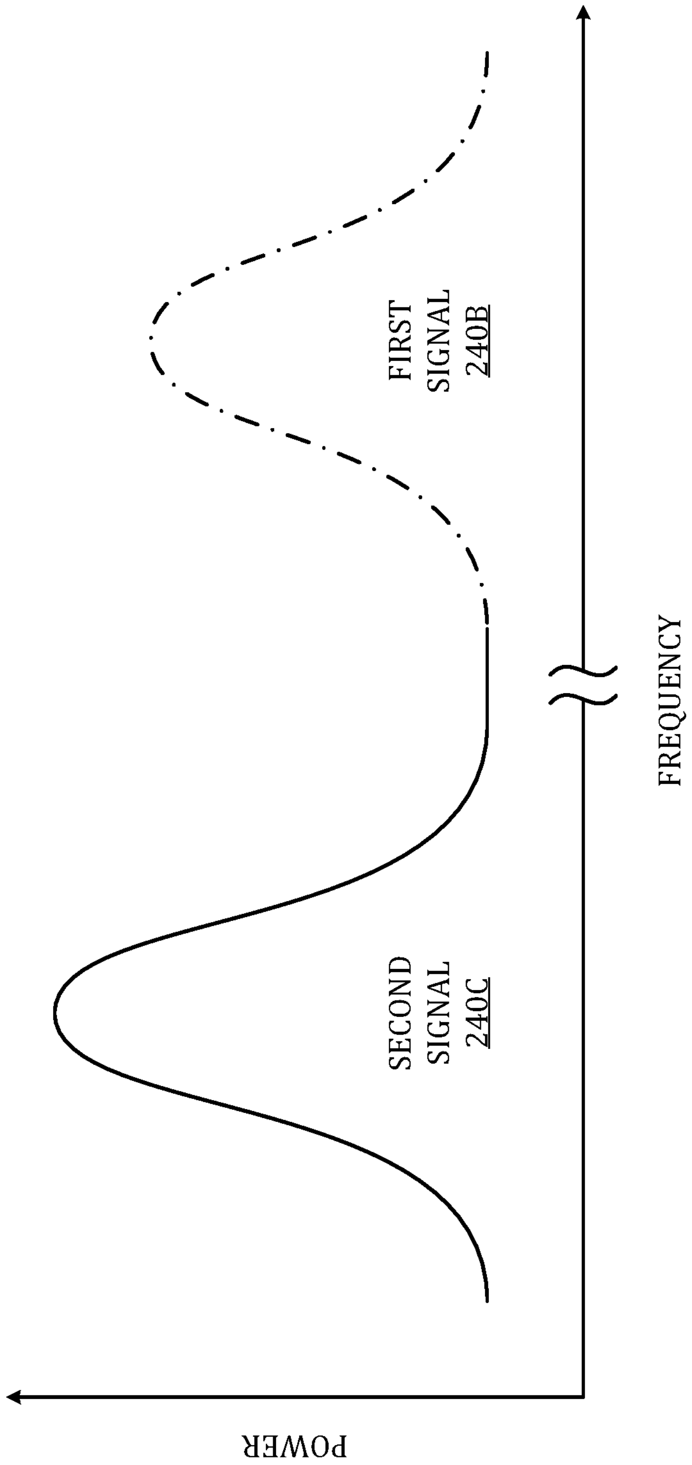
FIG. 2B shows aspects of prophetic frequency spectra for first and second signals in accordance with the disclosure herein.

As shown in the FIG. 2A, lighting-control signal 240C includes content of higher frequency relative to fan-control signal 240B. Prophetic frequency spectra for the respective control signals are represented in FIG. 2B. It will be noted that the range of frequencies in FIG. 2B may span any appropriate range.

Continuing in FIG. 2A, the first device, in the form of fan device 208B, is coupled to conductor SO and configured to respond commensurately to a first signal, in the form of fan-control signal 240B, in order to vary the rotation speed of the fan. However, the fan device is also configured to expose at least a second signal to a distinct second device. In the illustrated example the second signal takes the form of lighting-control signal 240C, and the second device takes the form of lighting device 208C.

FIG. 2A shows aspects of an exposure component 242. In the illustrated example the exposure component is coupled directly to the first device in the form of fan device 208B; in other examples, the exposure device may be arranged elsewhere in computer system 202 (vide infra). Generally speaking, the exposure component may be tasked with passing at least the higher-frequency second signal between the first device and any second or subsequent device with which the second signal is to be shared. To that end, an interdevice conductor 244 is coupled directly to the exposure component. The interdevice conductor 244 extends the SO conductor of microbus 232B to lighting device 208C.

In some examples exposure component 242 may include nothing more than a contact to interdevice conductor 244. In other examples the exposure component may include a high-pass or notch filter 246 configured to pass the higher-frequency second signal to the second or subsequent device but block the lower-frequency first signal. In some examples the exposure component may include a serial-to-parallel shift register 248 configured to (wholly or partially) demultiplex the second signal, for distribution to a plurality of downstream devices of computer system 202. In such examples interdevice conductor 244 may be one of a plurality of interdevice conductors routed to different devices within the computer system.

Figure 3:
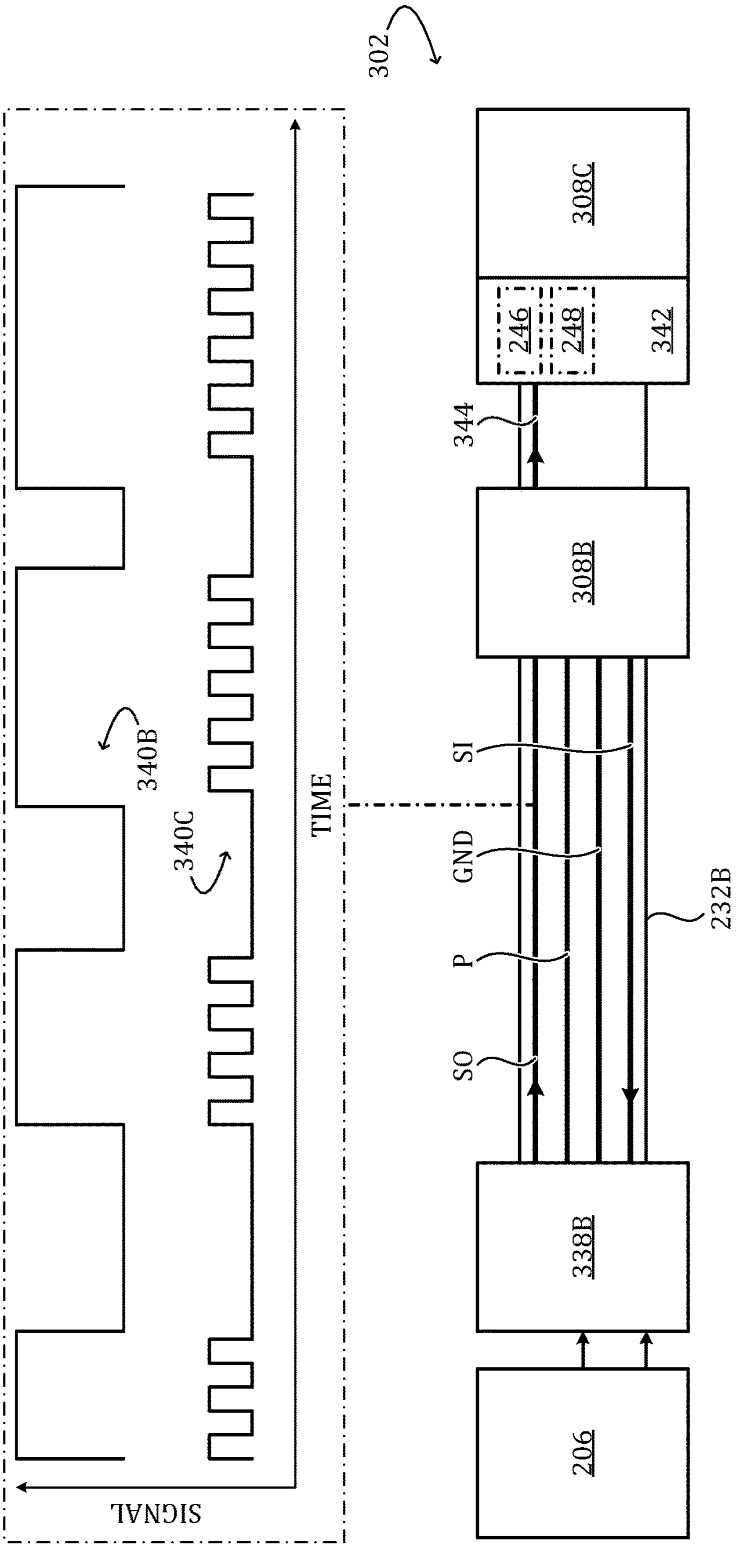
FIG. 3 shows aspects of yet other example computer systems.

FIG. 3 shows aspects of another computer system 302 comprising an exposure component 342. In contrast to the exposure component of FIG. 2A, exposure component 342 is coupled directly to the second device in the form of lighting device 308C. In this example, interdevice conductor 344 connects the exposure component to the first device in the form of fan device 308B. Based on the configurations of FIGS. 2 and 3, it will be noted that some of the functionality of the exposure components may be similar in the two examples but may also differ in some respects. For instance, frequency filtering, if employed, may be substantially the same in both configurations, and indeed a shift register may provide useful demultiplexing in both configurations. In the configuration of FIG. 3, however, demultiplexed signal would not be routed to different devices but may be used to control parallel components of the same device, such as different lamps of the same lighting device.

It should be noted also that virtually all of the functionality associated with an exposure component could be integrated into the first or second devices, in some configurations. Nevertheless, in any configuration in which the first and second devices are separated, an interdevice conductor of some kind would be necessary so that at least the second signal could be shared with a second or subsequent device. Furthermore, while the illustrated examples show a direct connection between device interface 238B and fan device 208B, and an extended connection to lighting device 208C, the connectivity of these devices to the associated device interface may be exchanged in other examples. In still other examples both devices may be directly connected to SO and both may have their own (optionally integrated) exposure components, in some cases including a dedicated frequency filter.

In these and similar configurations, lighting devices 208C and 308C respond to the higher-frequency content of lighting-control signal 240C, whereas fan devices 208B and 308B are substantially non-responsive to the higher-frequency content of the lighting-control signal.

In the illustrated examples, fan controllers 238B and 338B (a GPIO microcontroller interface, for instance) transmits fan-control signal 240B and 340B as PWM signal, with intermittent bursts of the higher-frequency lighting-control signal. These features are not strictly necessary because different (e.g., non-PWM) types of control signal are also envisaged. Generally speaking, the lighting-control signal may be transmitted according to any suitable serial protocol, such as a universal asynchronous receiver-transmitter (UART) protocol. In this way elongate conductor SO is used concurrently for two purposes: for control of the fan speed and of the lighting. This approach conserves microcontroller pin count, connector pin count, and printed-circuit board (PCB) routing area.

The solutions herein retain a first control protocol (e.g., PWM for the fan device) and add hard-wired communication for one or more subsequent devices using the very same pin, upon which the second and subsequent protocols are optionally and opportunistically overlaid. Examples include PWM+Serial and PWM+WS281x protocols, among others.

Figure 4A:
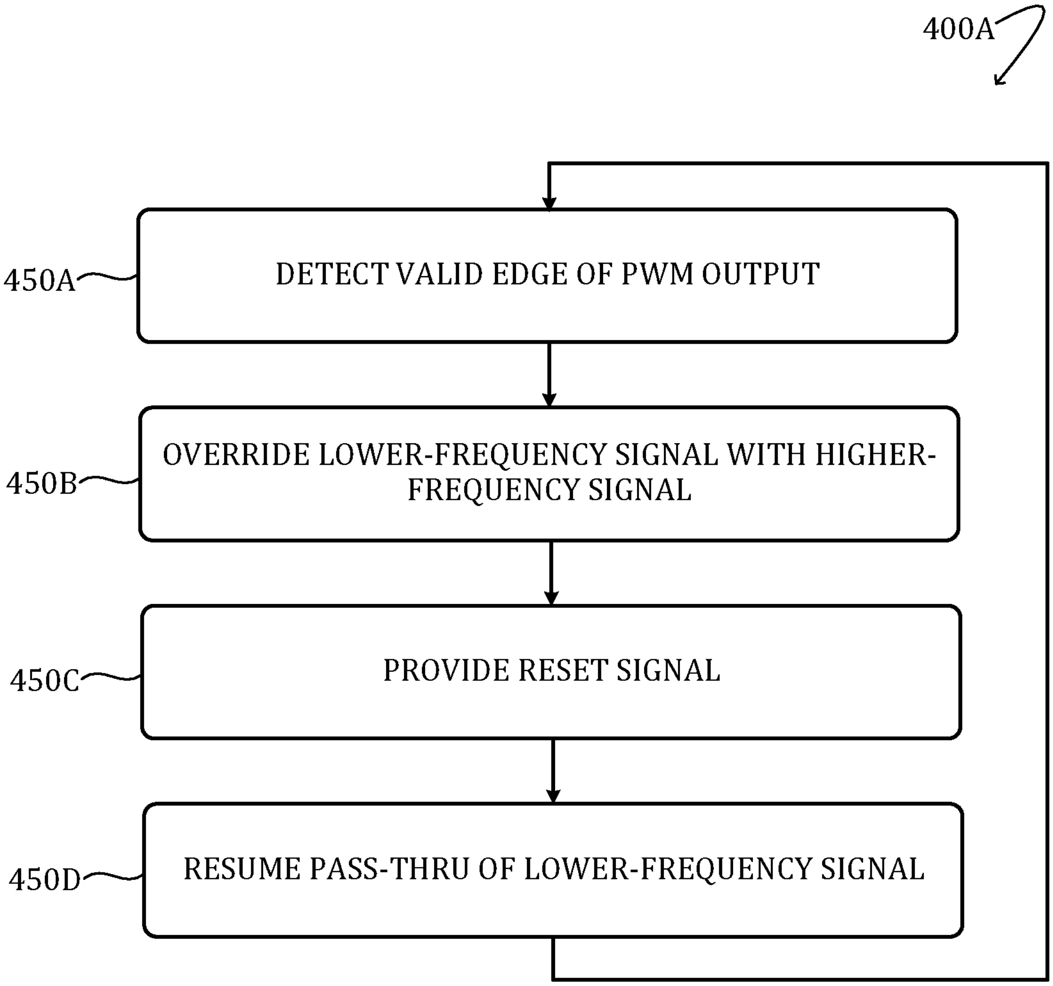
FIGS. 4A, 4B, and 5 show aspects of example methods of operating a computer system.

FIG. 4A shows aspects of an example method 400A to assert an overlaid protocol using PWM for fan control and WS2811 for lighting control. In this example the input comprises unmodified PWM. The detected or inferred PWM rate is preferably low enough to allow data transmission of the higher-frequency protocol within a single PWM cycle. In method 400A the output comprises overlaid PWM and WS2811 signal. In one example, lower-frequency protocol, the fan is driven via PWM at 200 Hz, with ON and OFF timeslots of approximately 5 milliseconds (ms) each. Naturally the relative ratio of ON versus OFF timeslots varies according to the desired fan speed, and there could be plural sequential timeslots that are ON or OFF. In this example, at 200 Hz, upon a stable transition from high to low signal, the PWM signal remains low for at least 4 ms.

In systems consonant with this disclosure the lighting device will not adversely change state when exposed to the lower-frequency fan-control signal. Certain strategies may be used to ensure this. For example, the high-frequency content of the lighting-control signal may be 'binned' so as to avoid transitions of the lower-frequency fan-control signal. In other examples the lighting device may receive a reset or latch with no high-frequency data (or <24 bits spurious data for 8-bit RGB), and therefore will retain its prior state without latching any new value. In still other examples the lighting device may be baseline-agnostic and recognize only transitions of selected frequency content—i.e., short-pulse transitions.

At 450A of FIG. 4A the control logic detects a valid edge of the PWM output. Optional features may be added to the methods to account for non-idealities, noise, and/or capacitance, ensuring that the target device registers the transition, and/or that the higher-frequency data transmission is positioned with respect to a PWM pulse at a preferred location. Examples of preferred locations include: (a) substantially centered within the PWM pulse, (b) having at least a minimum time of unchanged signal prior to the start of the higher-frequency data transmission, (c) having at least a minimum (potentially predicted) time following the end of the higher-frequency data transmission before the next PWM edge, or (d) positioned to balance transmissions across a (potentially predicted) PWM edge. At 450B the control logic overrides the lower-frequency signal with the higher-frequency signal. At 450C, when the higher-frequency transmission is complete, the control logic provides a reset signal (low for minimum overhead). At 450D the control logic resumes pass-thru of the lower-frequency signal.

Figure 4B:
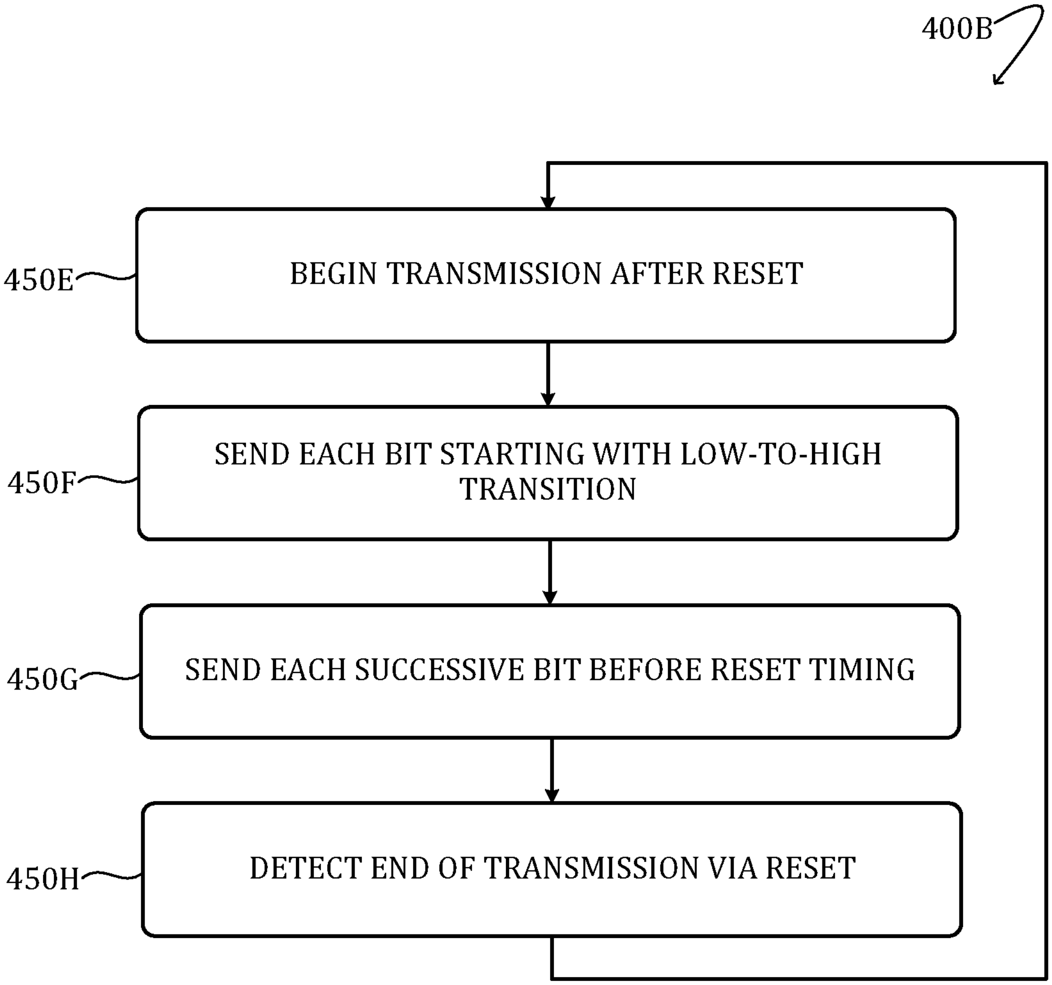

FIG. 4B shows aspects of another example method 400B to assert an overlaid protocol using PWM for fan control and WS2812 for lighting control. WS2812 uses a non return-to-zero (NRZ) protocol, with a typical transfer rate of 800 kHz, and 1250 nanoseconds (ns) per bit. Values are latched by the pixels after detecting a reset signal—e.g., a low signal >50 microseconds (μs) in duration.

At 450E of method 400B the transmission begins after a reset, which is defined as at least 50 μs of low signal. At 450F each bit of data is sent, starting with a low-to-high transition: 0 corresponding to 250 ns high and ≥1000 ns low; 1 corresponding to >1000 ns high and ≥250 ns low. At 450G each successive bit is sent well before reset timing occurs, typically targeting 1250 ns per bit overall. At 450H the end of transmission occurs by at least 50 μs low.

The following, more particular instantiation of method 400B uses a 200 Hz PWM signal and 50×RGB WS2812 pixels. Each pixel in this case uses 24 bits of data to define intensity of the three colors to display, thus requiring 50×24 bits of data to update all the pixels. The large number of RGB pixels is for illustrative purposes, as a typical PC lighting device is more likely to have one to ten uniquely addressable RGB pixels. In this example the valid edge is the falling edge of the signal. At least an additional 50 μs delay may be added where the signal remains low, to ensure that the pixels detect a RESET signal. The control logic then overrides the original signal while sending 1200 bits of data using the WS2812 protocol, which in total takes ~1.5 ms (1200 bits*1250 ns per bit). The control logic continues to override the original signal for an additional ≥50 μs of low signal, to ensure that the pixels detect the RESET/LATCH data. Finally, after the RESET at 450H the control logic resumes the pass-through of the lower-frequency signal.

Despite the utility of the foregoing examples, it will be noted that the original signal can be overridden at any time. This variant simplifies the control logic and allows merging of the higher-frequency protocol without placing timing constraints and/or introducing wait periods on the higher-frequency protocol.

Returning to the illustrated example, one pixel of RGB data corresponds to 24 bits. For 50 pixels of data, that corresponds to 1200 bits. Given a transmission target time of 1250 ns transmission time per bit, transmitting 1200 bits requires 1.5 ms. The WS2812 duty cycle is between ⅓ (at the lowest) and ⅔ (at the highest). Therefore, in this example, the SO line will be driven high for an additional, cumulative total of about 0.5 to 1.0 ms during the PWM timeslot, relative to the scenario in which PWM holds the line low. For a 200 Hz PWM output to the fan device, the shortest OFF time corresponds to a single 25 ms timeslot. Therefore, in this example, sending the data for 50 WS2812 pixels represents a PWM variability of 0.5 to 1.0 over 25, or 2% to 4% of the energy delivered in that timeslot.

In examples where the timeslots are of fixed length, the control logic may detect the length of a prior timeslot by measuring the time interval between signal edges. In examples in which the length of a timeslot can be predicted, and the higher-frequency protocol data transmission time is known, it may be possible to defer higher-frequency transmission—e.g., if generated by or buffered by the logic. More specifically, the logic can choose to center the transmitted higher-frequency data. Further still, the logic can intentionally aim to center the transmission across the lower-frequency edge—e.g., the original signal would be 50% high, 50% low, thus reducing the variability of total energy transferred.

In the foregoing example a 25 ms timeslot−1.5 ms of data−(2×50 μs for resets) results in about 23 ms of the timeslot not overridden by the higher-frequency protocol. Thus, a method for centering the transmission between edges may comprise (1) waiting for the falling edge+~11.5 ms continuous low signal; (2) sending higher-frequency protocol data (~1.5 ms); and (3) ensuring that the SO line stays low for >50 μs, to achieve the final reset and latching of the data. Centering the transmission on a rising edge could include (1) waiting for the falling edge+24.25 ms; (2) sending higher-frequency protocol data (to about 1.5 ms); and (3) ensuring that the SO line stays low for >25 μs, to achieve the final reset and latching of the data. Similarly, centering the transmission on a falling edge could include: (1) waiting for rising edge+24.25 ms; (2) overriding with low for >25 μs for initial reset; (3) sending higher-frequency protocol data (to about 1.5 ms); and (4) ensuring that the SO line stays low for >25 μs, to achieve the final reset and latching of the data. Centering on the rising edge would be substantially similar, with the added override of a leading reset and/or latch signal. In other examples an RGB pixel may have inverted signaling (normally high, reset is high for >X μs, etc.). For such pixels, centering would be based on the rising edge, with inversion of relevant signals. Other addressable pixel NRZ protocols may be used, with different baud rates and/or different timings used for encoding of zero or one bits. These other protocols are usable with minimal changes to the numerical calculations above.

An alternative to the WS81x protocols is a generic serial protocol. Serial data transmission may be initiated during a high signal. In one example, this could include a start bit, data bits, optional parity bits, and a stop bit, before reverting to the lower-frequency signal. A baud rate of 115,200 bps (bits-per-second), encoded using 8N1 (no parity, single stop bit per byte) may be used in one, non-limiting example. Each bit takes about 8.68 μs and 10 bits are transmitted per byte of data. Thus, sending 150 bytes of RGB data would require about 13.02 ms. This would still fit within a single PWM timeslot, although with significantly higher impact due to the slower bit rate (115.2 versus 800 kbps). Even at such lower frequencies, undesired effects can be mitigated by limiting the frequency at which the higher-frequency protocol overrides the lower-frequency protocol. As an example, for a 200 kHz PWM fan, a 0.5% maximum variation can be reached by altering no more than 1% of the timeslots. In some examples a much higher baud rate (e.g., 1 Mbps) may be used. This results in data rates for 8N1 which are nearly identical to that of the WS2812 protocol, after accounting for the overhead (10/8 of 1 Mbps is about 800 kbps).

The solutions illustrated above allow pre-existing first devices to operate with no need for after-market expansion connectors or other hardware. No cost is added to a pre-existing fan device, for instance. Instead, the pre-existing connector can be used even when a higher-frequency second device is envisaged. The illustrated examples take, in effect, a fan-device connector with four wires from a PC motherboard and add lighting support via a serial protocol on top of the PWM fan-control signal. In some examples, it is necessary to modify only the fan device to add serial-protocol interpretation for the lighting device. In other examples, all of the interpretation is enacted in the lighting device itself, so the fan device can be unmodified. In either case, the second device that uses the higher-frequency serial protocol can be engineered to require the minimum number of serial transactions, so as to reduce disturbance to the lower-frequency first device. In still other examples the second device (e.g., the lighting device) may be a standard device, if tolerant of the lower-frequency first signal underlying the serial protocol, or equivalent.

By way of comparison, some fan devices with integrated lighting, so-called 'RGB fans', include a four-pin connector for fan control and a separate three- or four-pin connector for driving the integrated LED lamps. Other RGB fans include a four-pin connector for fan control and a separate three-pin connector (power, data, and GND), using NRZ signaling, such as WS2812 to control addressable pixels. Such configurations require space and pin assignments for two connectors on the motherboard and microbus routing for two interfaces on the integrated device. By contrast, the solutions here disclosed provide LED-extended fan support with no additional connectors, as noted above. While the existing four-pin fan connector would remain, no additional lighting connector would be required (or an existing lighting connector could be removed). Moreover, a fan without lighting would work with its original connector without any modification, even if the motherboard happens to transmit the additional lighting-control signal.

More particularly, the methods herein provide PWM control of a fan device and concurrent control of a lighting device with backward and forward compatibility: basic operation is preserved for a state-of-the-art fan device whether or not the motherboard is modified as disclosed herein; a modified fan device will also provide basic operation when coupled to a state-of-the-art motherboard; and combined operation (fan plus lighting control) is provided when a modified motherboard is used in conjunction with modified fan and lighting devices. In some implementations, firmware-only motherboard updates could enable the second protocol, without hardware revision to the motherboard. This approach opens up additional options for SKU differentiation and post-sales functionality upgrades.

In FIGS. 2 and 3, where the fan and lighting devices are both output devices, it follows that the fan interface must transmit both the fan-control signal and the lighting-control signal 340C. That aspect is not strictly necessary, however, for in other examples a device interface may receive signal from one device and transmit signal to another device. In still other examples the device interface may receive signal from two or more devices linked thereto by one or more conductors. In some examples the PWM line may include a pull-down resistor, and the fan control interface only pulls high, floating for low signal. Similarly, the high-frequency control interface for lighting may also only pull high and may float for low signal. This methodology may be appropriate for a non-inverted WS281x protocol. Likewise, the inverse of the above—using a pull-up resistor, where the fan controller only and the high-frequency control interface only pull the line low—may be applicable for a serial protocol.

In addition to the fan device illustrated herein, a lower-frequency (first) output device may take the form of a haptic-feedback device, a joystick controller, a servo for a 3D printing system, a solenoid-actuated valve, or a liquid coolant pump for a graphics-processing unit (GPU), etc. A lower-frequency (first) input device may take the form of a power switch, temperature sensor, ambient-light sensor, accelerometer, or gyroscope, etc. In addition to the lighting device illustrated herein, a higher-frequency (second) output device may take the form of an audio output, a serial-device output, etc. A higher-frequency (second) input device may take the form of an audio input, a serial-device input, etc.

Irrespective of the direction of the transmission, the primary function of the lower-frequency first signal (e.g., PWM signal for fan control) is preserved in the configurations and methods herein. In engineering the overall solution, the signal perturbation required to support a second device (e.g., the lighting device) is evaluated. If the first device is able to tolerate that amount of perturbation without unacceptable adverse effects, then the two signals may share the same conductor.

Figure 5:
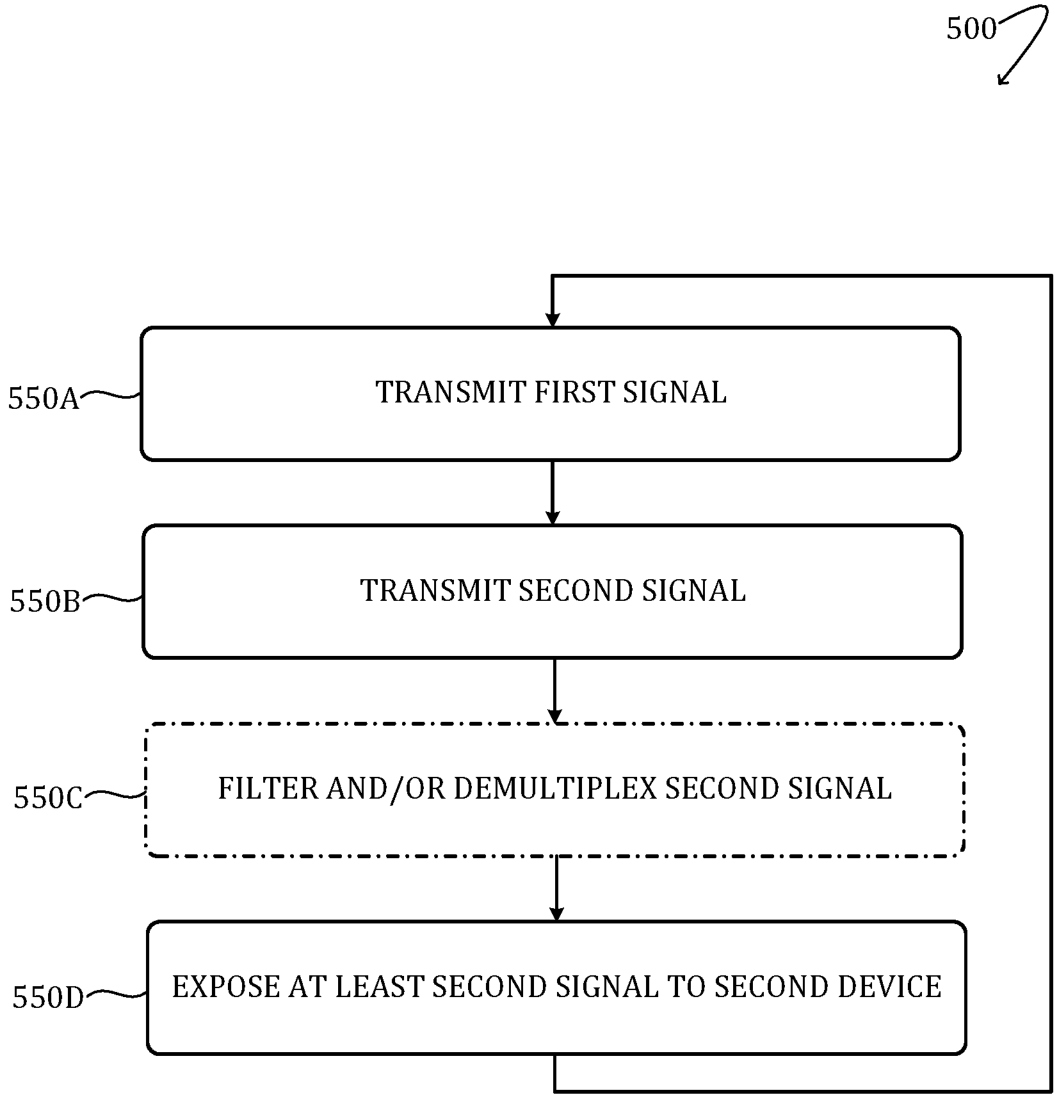

In view of the foregoing discussion, FIG. 5 shows aspects of an example method 500 of operating a computer system. At 550A a first signal is transmitted between a device interface and a first device over an elongate conductor. At 550B a second signal is transmitted between the device interface and the first device over the same elongate conductor. The second signal includes content of higher frequency relative to the first signal. In some examples the first and second signals are control signals. The device interface is a device controller, accordingly, and the first and second signals are transmitted from the device interface to the first device—i.e., the device controller induces a change in the signal, such as driving from a high-impedance state to a high or low state, for instance. In some examples at least one of the first or second signal is a sensory signal. Here the sensory signal is transmitted from the first device to the device interface. At 550D at least the second signal is exposed to a second device distinct from the first device. The first device is substantially non-responsive to the second signal. At optional step 550C the second signal is subjected to frequency filtering to suppress the lower-frequency first signal, and/or demultiplexing to route the appropriate portions of the second signal to the desired target components, as noted hereinabove.

In the examples shown in FIGS. 2 and 3, a device interface 338 emits first and second signals whose timing may derive ultimately from a motherboard clock. Meanwhile each of the interconnected devices operates asynchronously or according to a timing defined in some other manner. In other examples, however, it is advantageous to share the timing of a device interface with one or more of the interconnected devices. In other words, it may be advantageous to extend a timing signal from a device interface to at least some of its interconnected devices, in addition to the multi-purpose, multi-bandwidth data signal described above. This would enable the interconnected devices to operate synchronously with respect to the device interface and/or motherboard. In the spirit of this disclosure, that extension should be achieved without using additional microbusses or conductors between the device interface and the interconnected devices.

The most direct extension to the synchronous case can be realized in computer systems (not shown in the drawings) where a device interface already provides a clock line to a first device. In such examples, the clock line can be extended to a second or subsequent device, thereby enabling synchronous operation of the second or subsequent device. In device interfaces where no dedicated clock line is already provided, but a plurality of signal lines join a device interface to first device, then a second or subsequent signal line may serve double duty by carrying a timing signal for the second or subsequent device, just as the first signal line was used to carry concurrently the first and second control or sensory signals. In some examples, the plurality of signal lines may carry signal in the same direction—e.g., from the interface to the device. That feature is not at all necessary, however, as described presently in connection to FIG. 6.

Figure 6:
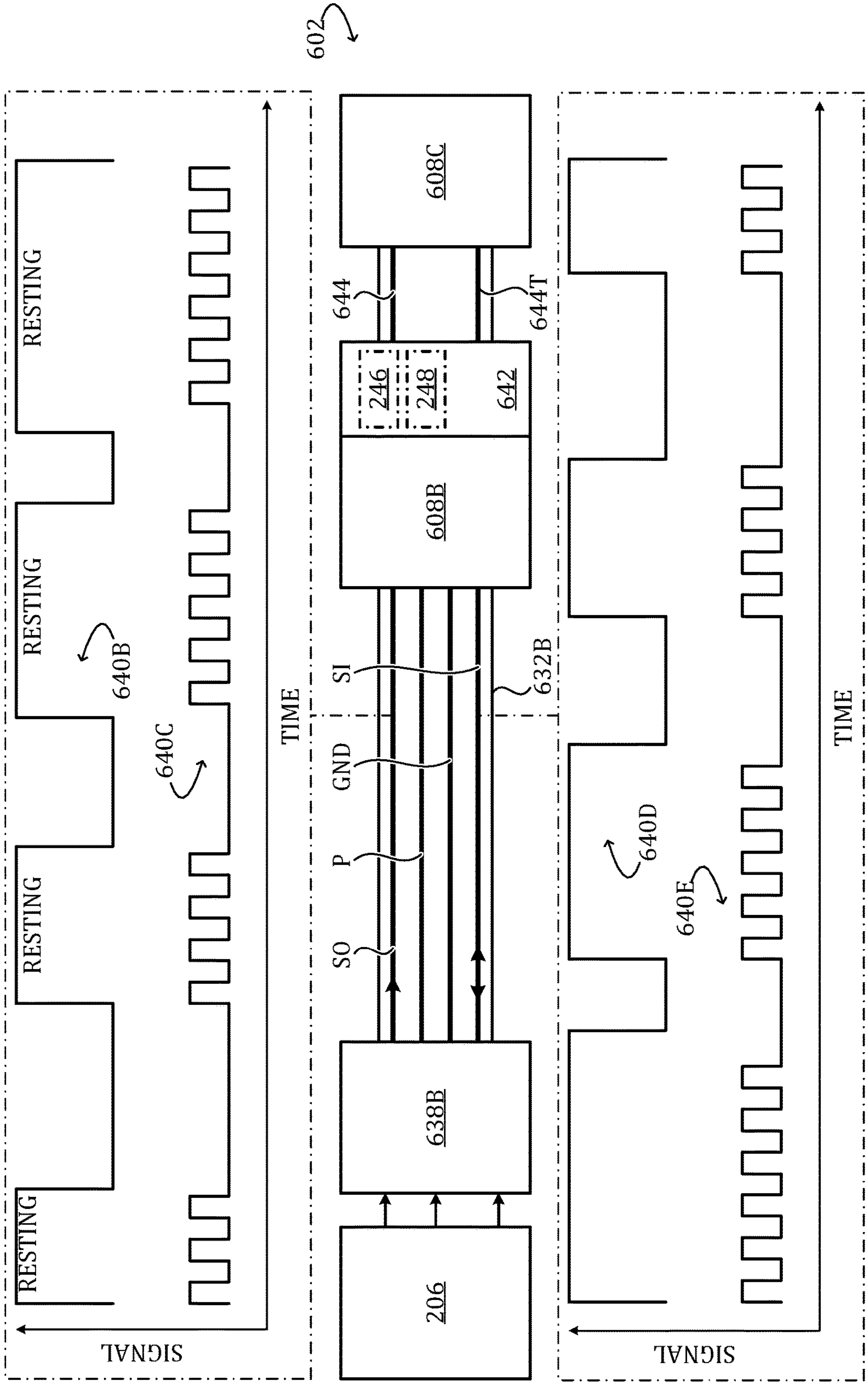
FIG. 6 shows aspects of another example computer system.

FIG. 6 shows aspects of another example computer system 602. As in the previous examples, a first device in the form of fan device 608B is coupled to a plurality of elongate conductors of microbus 632B. A device interface in the form of fan controller 638B is coupled also to the plurality of elongate conductors. The fan controller is configured to transmit a first signal in the form of fan-control signal 640B (e.g., a PWM signal) over the SO conductor of the microbus. Based on the fan-control signal, the fan device varies the rotation speed of the fan. As in the examples of FIGS. 2 and 3, the fan controller is also configured to transmit a second signal in the form of lighting-control signal 640C over the SO conductor, the lighting-control signal including content of higher frequency relative to the fan-control signal. Exposure component 642 includes an interdevice conductor 644 that exposes the lighting-control signal to the lighting device, and an interdevice conductor 644T that exposes the lighting-clock signal to the lighting device.

Returning briefly to FIG. 1B, a Hall-effect or other sensor 152 of fan device 108B is configured to sense the azimuth of the fan rotor and thereby emit a periodic waveform of a frequency proportional to the rotation speed. As noted hereinabove, the SI line may have a pull-up or pull-down resistor (not shown in the drawings), and assert small pulses to low twice per rotation. This waveform, after appropriate shaping, optionally, is transmitted back to fan controller 138B as TACH signal 140D, along the SI conductor of microbus 132B. By regulating the fan-control signal 140B in dependence on TACH signal 140D, the fan controller can control the rotation speed in a closed-loop manner, accounting for bearing wear, dirt, and other non-idealities of fan device 108B. As the rotation speed may be limited to about 50 rotations per second (or 3000 rotations per minute), the frequency of the TACH signal may be limited to values of the same order of magnitude.

Returning now to FIG. 6, computer system 602 fan controller 638 is configured in some examples to recognize a resting state (vide infra) of TACH signal 640D and during the resting state to periodically and momentarily drive the SI conductor out of the resting state. In this way the fan controller may transmit a timing signal in the form of lighting-clock signal 640E over the SI conductor during the resting state. Advantageously, lighting-control signal 640C may be synchronized according to lighting-clock signal 640E. For the reasons indicated hereinabove, fan device 608B is substantially non-responsive to the lighting-control signal 640C and to lighting-clock signal 640E. For example, the fan device 608B may interface with the SI conductor only as an input, and be tolerant to short (higher-frequency)

pulses where its driving a lower-impedance output state would conflict with the timing signal being driven by the fan controller.

As shown in FIG. 6, the sub-period during which the SI conductor is driven out of the resting state may be very short relative to the TACH pulses regularly asserted on the SI conductor by fan device 608B. In some examples fan controller 638B momentarily drives the SI conductor to the logical opposite of the resting state: to 0 if the resting state is 1, or 1 if the resting state is 0. In other examples the fan controller momentarily drives the SI conductor to a voltage in between the voltages corresponding to the 0 and 1 states. In some examples, fan device 608B is configured to drive the SI conductor via an open-drain or open-collector circuit, such that the resting state is a high-impedance state readily overcome by drive logic of fan controller 638B. Thus, in some examples SI of FIG. 6 is pulled high to effect higher-frequency pulse transmission. This solution is appropriate whether SI is nominally grounded or in a high-impedance (e.g., open collector or open drain) configuration and allowed to float. More generally, the SI connector may transition from a high-impedance state to some other state that attempts to drive the signal to a value. For some fan devices, the SI line may have a pull-up resistor as noted above, and the fan would typically have an open collector that pulls to ground for a brief moment twice per revolution. However, so long as the fan controller and pull-up (or pull-down resistor) correspond, the inverse could be configured. In other words, an SI line may be configured with a pull-down resistor, and the device could have an open emitter or open source that is normally high-impedance and drives the line high when turned on.

The maximum rate of change on the TACH signal can be estimated in light of the physical constraints. Thus, the time between prior pulses is indicative of a minimum time until the next pulse. Accordingly, the two-wire I2C protocol can be enacted using both the SO and SI lines of a single fan device. The end result is bi-directional communication. In some examples it may be preferable to use SO instead of SI for the serial clock (SCL) function of the I2C protocol. This is to prevent a 'stuck' fan from locking up the I2C bus—an effect known as 'clock stretching'. In contrast, if a fan rotor stops rotating while the SI line has been pulled low, then the only adverse effect is an interruption of the I2C data transfer. Thus, the configuration of FIG. 6 is more fault-tolerant than the similar configuration in which the I2C signals applied to SI and SO are exchanged. In this example, the SI conductor conducts bidirectionally between the fan controller and the fan device, inasmuch as the TACH signal flows to the fan controller except during the resting state, and where the lighting-clock signal flows from the fan controller during the resting state.

In FIG. 6, fan device 608B is configured to expose a timing signal in the form of lighting-clock signal 640E to a distinct second device in the form of lighting device 608C, together with lighting-control signal 640C. In some examples the lighting device is configured, via the appropriate high-frequency protocol, to sample the lighting-clock signal only during the resting state of the SI conductor. In this manner the lighting-control signal may be used in a reliably synchronous manner, to control lighting device 608C.

In this example two GPIOs on a microcontroller normally used to send and receive control signals to a device are repurposed. More specifically, both the SO and SI lies are overloaded by adding intermittent bursts of a two-wire communication protocol, such as I2C or serial peripheral interface (SPI). This approach allows additional, synchronous information to be encoded on the same conductors and received by additional devices, all without disrupting the functionality of the pre-existing control signals. More specifically, by having the microcontroller change its GPIO configuration to transmitting I2C, where either the SO briefly becomes the serial data (SDA) line of I2C, and the SI line becomes the SCL of I2C (or vice versa), the device interface may send brief transactions of I2C data (or another communication protocol) without disrupting the rotation speed of the fan. In this manner, an additional device or additional functionality can be supported by the two existing lines, to exchange arbitrary data.

In one example the higher-frequency signal can be transmitted using a serial protocol (e.g., 8N1) at about 1 Mbps. At this bit rate it is possible to overlay control of 50×RGB pixels that use I2C over existing PC-PWM fan connection. More generally, these solutions retain a first control protocol (e.g., PWM) and then add hard-wired communication for one or more subsequent devices using two or more pins, where second and subsequent protocols are optionally and opportunistically overlaid. Examples include PWM+I2C protocols, among others.

Figure 7:
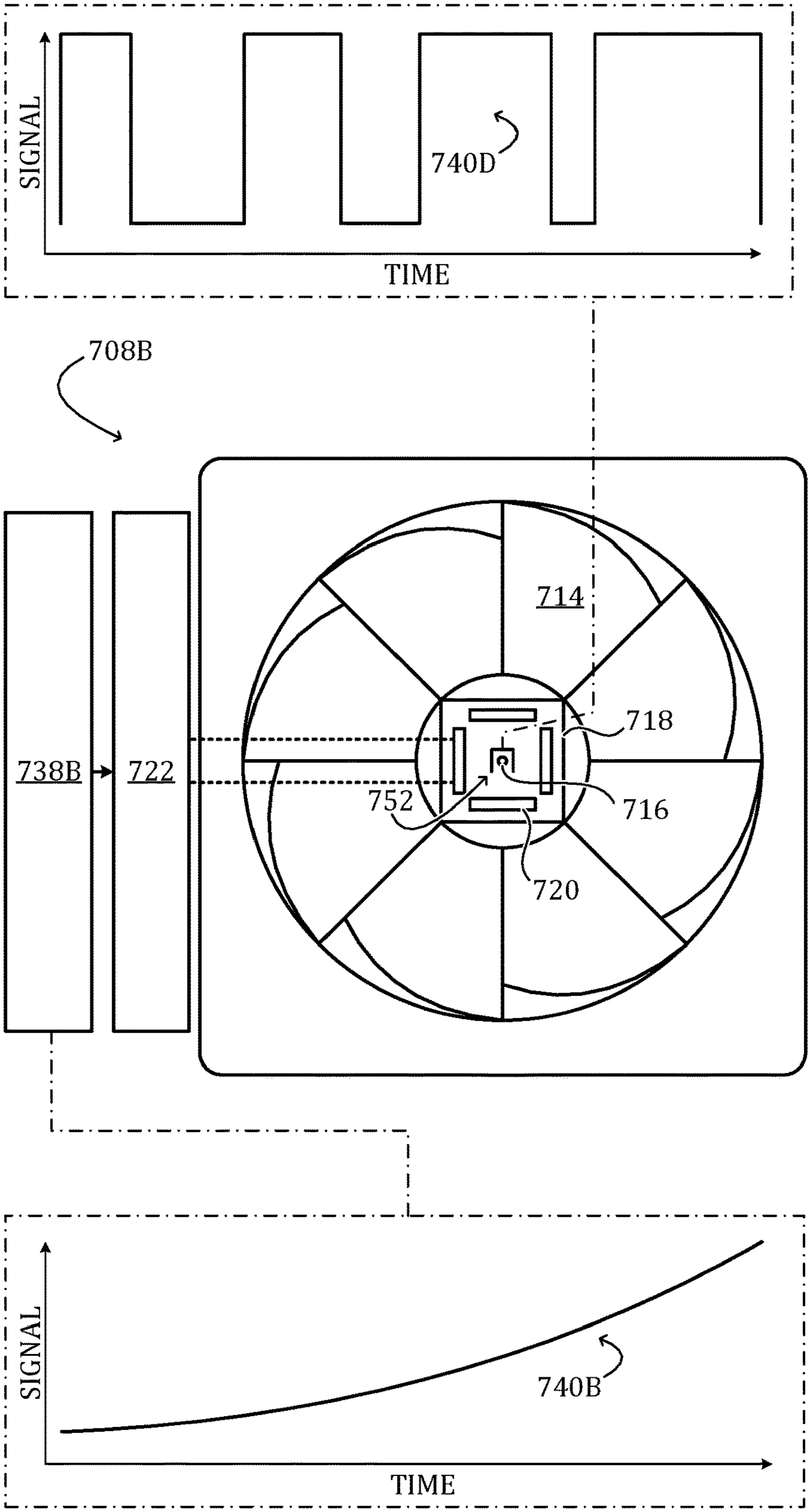
FIG. 7 shows aspects of another example fan device of a computer system.

In the foregoing examples some emphasis is placed on fan devices of the kind shown in FIG. 1B, with rotation speed controlled via a PWM signal. That aspect is not strictly necessary, however, as fan devices of other kinds are equally envisaged. FIG. 7 shows aspects of an example fan device 708B comprising a bladed impeller 714, rotor 716, electric motor 718, stator coils 720, drive circuit 722, and Hall-effect sensor 752. As in the example of FIG. 1B, fan controller 738B receives a TACH signal 740D along the SI conductor of the microbus. However, in fan device 708B the rotation speed of the rotor is commensurate to an analog signal 740B. In some example, the analog signal may vary from zero to twelve volts. Fan device 708B may be coupled to three conductors instead of four: GND, SO (which carries analog signal 740B), and SI (which may carry a TACH signal). As described further below, the SI line can also be used to concurrently carry a higher-frequency, second output signal to be conveyed through the fan device. By way of example, given a maximum fan speed of 3000 rpm (50 rotations per second), two pulses per rotation corresponds to 100 TACH pulses per second. This gives a minimum time between falling edges on the tach line of approximately 10 ms, which is orders of magnitude greater than the time window discussed above with respect to the fan device of FIG. 1B.

Both three- and four-pin fans may be supported using a single common code base, wherein some firmware would always use the tach pin (even if a PWM pin was available) to send the higher frequency data. This option would also enable an RGB LED fan to work over both three- and four-pin connectors, without changing the hardware configuration.

More generally, the approach of FIG. 6 is useful because it avoids additional connectors and wire traces for the communication protocol, conserving microcontroller pin count, PCB routing area, and connector pin counts. The examples above mostly illustrate how data and/or clock signals are transmitted from a device interface 638 to the various interconnected output devices. However, this disclosure is equally consonant with the interfacing of various input devices, where data and/or clock signals are transmitted in the opposite direction. This variant is recognized explicitly in the process flow illustrated in FIG. 8.

Figure 8:
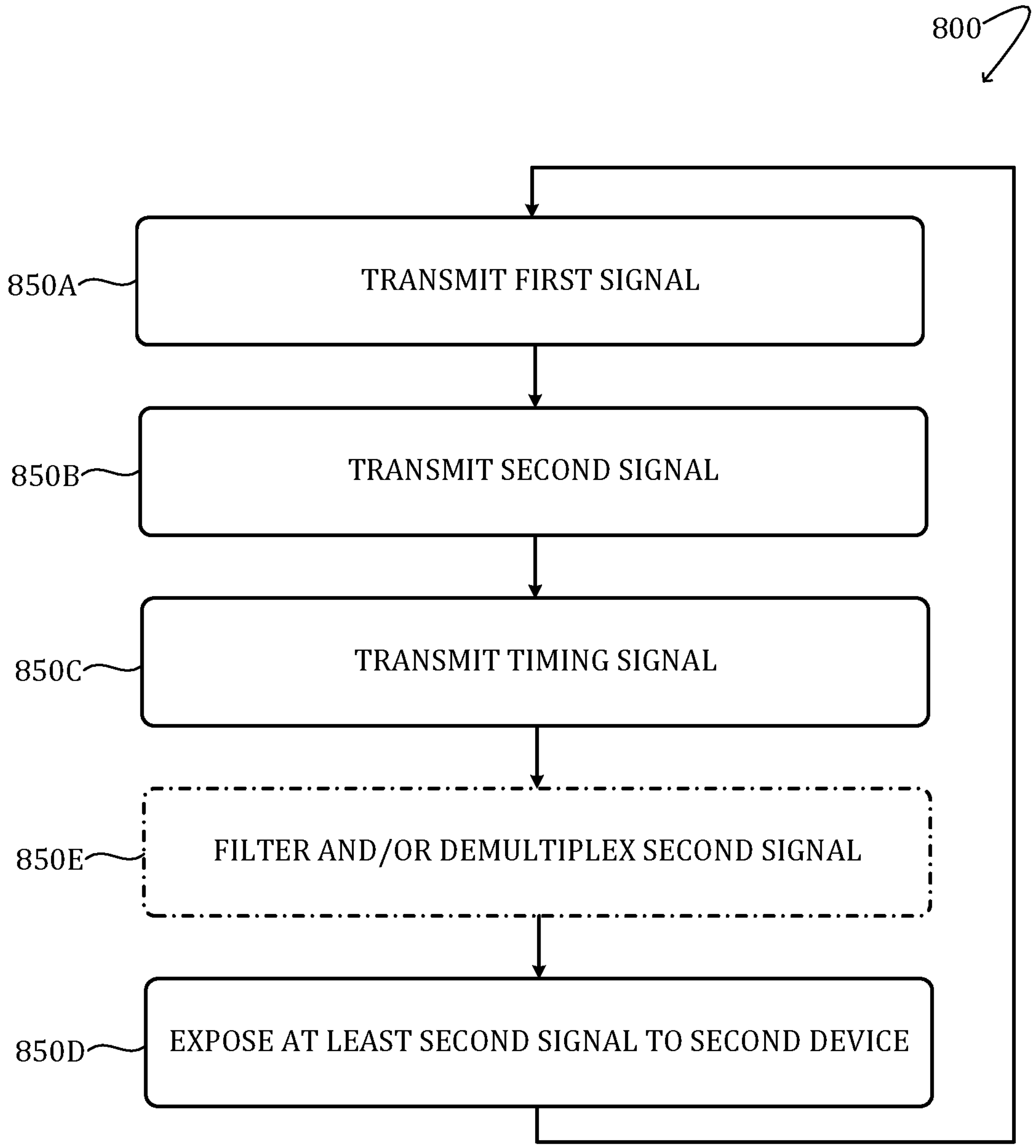
FIG. 8 shows aspects of another example method for operating a computer system.

FIG. 8 shows aspects of an example method 800 for operating a computer system. At 850A of method 800 a first signal is transmitted between a device interface and a first device over an elongate first conductor. At 850B a second signal is transmitted between the device interface and the first device over the elongate first conductor. In some examples the first and second signals are control signals, the device interface is a device controller, and the first and second signals are transmitted from the device interface to the first device. The second signal includes content of higher frequency relative to the first signal. At 850C a timing signal is transmitted between the device interface and the first device over an elongate second conductor. In this method the timing signal is used to provide synchronization of the second signal. At 850D at least the second signal and the timing signal are exposed to a second device distinct from the first device. As noted previously, the first device is substantially non-responsive to the second signal and to the timing signal. In method 800 at least the first or second elongate conductor conducts bidirectionally between the device interface and the first device. In some examples, bidirectional signal conduction is achieved absent reconfiguration of the device interface. In some examples only the second elongate conductor, which conducts the timing signal, conducts bidirectionally. At optional step 850E the second signal is subjected to frequency filtering to suppress the lower-frequency first signal, and/or demultiplexing to route appropriate portions of the second signal to the desired target components, as noted hereinabove.

The broad applicability of method 800 should not be construed to be limited to the particular examples shown in the foregoing drawings or description. It extends, for instance, to scenarios in which a conductor normally configured to carry a lower-frequency input signal from a device back to a GPIO is temporarily repurposed to accommodate a higher-frequency output signal transmitted to the device.

Consider the case of a PC having a motherboard with a GPIO interfaced to the POWER/RESET button. Normally this GPIO would be an input, and the motherboard firmware would poll the state of the GPIO in order to determine whether the user has pressed the button. Due to mechanical constraints, the user would have to press or hold the button for some duration for it to be detected, so the input polling rate could be rather low. This affords an opportunity to overload the conductor as an output to control a lighting device in the period between successive polling of the input. The firmware could change the GPIO to output mode, transmit RGB information for the lighting device (using UART or any other protocol which is fast enough to send all of the desired data within the inter-polling period), and then return the GPIO to input mode for continued low-frequency polling of the POWER/RESET button. Optionally, the firmware may be configured to variably set the polling rate of the input so as to accommodate the desired output during the inter-polling period.

Even if the user were to press the POWER/RESET button when the GPIO was set as an output, in mid-transmission of RGB data, the only adverse effect is that the conductor would be forced low while the button is held down. Although the output transmission would be corrupted, that effect is likely to be irrelevant as the user is in the process of changing the power state anyway. In the case of a RESET or POWER-ON transition, a temporary lighting glitch would likely be tolerable and would resolve as soon as the user released the button. Moreover, since the inter-polling period is dedicated to transmission of the RGB data, the system could not miss the detection of the button press: as soon as the firmware polls the input and detects the button press, it would suspend operating the GPIO as an output until the button is released.

In sum, because the system is able to tolerate the perturbation with no adverse effects, the two signals may share the same conductor and thereon transmit bidirectionally. In this example the second device (viz., the lighting device) may not be 'non-responsive' to the lower-frequency signals on the shared conductor in an operational sense, but there is little or no performance impact due to the unintended response.

No aspect of the foregoing drawings or description should be interpreted in a limiting sense, because numerous variations, extensions, and omissions are equally envisaged. For example, FIG. 6 illustrates a configuration in which the SI conductor of microbus 632B carries a TACH signal in from fan device 608B, and also carries a clock signal out to lighting device 608C. That configuration supports various two-wire protocols, in which the SO conductor of the same microbus carries control to both devices. In other examples, however, the SI line can be repurposed for bidirectional signal transmission supporting a one-wire protocol (e.g., WS281x), where the SO conductor carries only the signal for which it was originally intended. In other words, higher-frequency output signal to a lighting device may be carried over SI to an exposure component of the fan device, and then on to the lighting device via a interdevice conductor. Meanwhile, the SI conductor continues to serve its original function of carrying TACH pulses back to the fan controller. While this additional example is described in terms of the same fan and lighting devices illustrated throughout this disclosure, it applies equally to first and second devices of virtually any kind, having response functions sufficiently separated in frequency (with reference to FIG. 2B).

In some examples the actuation of a lower-frequency device (e.g., the rotation speed of the fan rotor) is a function of the power delivered according to a PWM waveform. In such examples, the logic for overlaying the higher-speed protocol may be configured to reduce or limit the impact of the higher-frequency signal on total energy transfer. One option is to track the prior transmission length and the worst-case energy variation. This would allow logic to pause the high-energy signal for a calculable period of time, before resuming the overlay of the higher-frequency transmission.

Using as an example the above illustration for serial transmission, with a 0.5% variation target, the higher-frequency transmission time was 13.02 ms, with 90% power reduction in the worst case reduction (if sending all zeros). Thus, the worst-case energy reduction for that transmission was equivalent to holding the signal low for 11.718 ms (90% of 13.02 ms). In order to limit the power variation to 0.5% or less the controller can ensure that 200x that amount of time has passed before it again overrides the lower-frequency signal with the higher-frequency signal: 11.719 ms×200 corresponds to 2343.8 ms. Thus, if the prior triggering edge was less than 2343.8 ms earlier, then the logic may ignore the current trigger. Alternatively, the logic may disable (or not re-enable) an edge trigger until this minimum time has elapsed. In some examples much higher speeds may be used—e.g., 1 Mbps or about 10× the speed of the 115200 baud example. Thus, the delay between transmissions (if all else remained the same) would be <250 ms at 1 Mbps.

The procedure for encoding these considerations into the controller logic is as follows: (1) Enable a one-time trigger interrupt and wait for the interrupt; note that this may include multiple steps, such as steps to filter noise. (2)

Optionally for more centered transmission it is possible to (a) start a timer configured to wait until the override is centered in a timeslot, and (b) wait on that timer. (3) Start a timer or measure ticks, to measure data-override transmission time. (4) Override the signal, and send higher-frequency protocol data. (5) Stop the timer or measure ticks, to measure data override transmission time. (6) Delay to meet the maximum energy variation requirement, including (a) calculating the actual or worst-case effective variation time, (b) calculating delay time to meet energy variation requirement, and (c) delaying for that time (e.g., set a timer and wait for the timer interrupt). (7) Go back to step 1, enabling the trigger again.

Concerning the range of hardware variations envisaged herein, a small circuit could, for a predetermined protocol, have independent inputs of both the lower-frequency signal(s) and higher-frequency protocol signal(s), and have logic that automatically detects when the higher-frequency signal is active. When the higher-frequency is not active it could output the lower-frequency signal, and, when the higher-frequency is active it could output the higher-frequency signal. This solution could be appropriate, for instance, for I2C, based on transitions of the incoming clock signal, with no clock transition for predetermined time indicating the end-of-active time. This approach differs from a typical IO switch at least because the activity is auto-detected, resulting in automatic overriding of which signal is output. In examples in which the logic for generating both the lower-frequency protocol and higher-frequency protocol control are located at the same source (e.g., firmware controlling an output pin), the logic could modify (or selectively override) the output of the lower-frequency protocol. This important feature can be achieved, accordingly, without user reconfiguration of the hardware or software.

The control methods herein may be tied to a computer system of one or more computing devices. Such methods and processes may be implemented as an application program or service, an application programming interface (API), a library, and/or other computer-program product.

Figure 9:
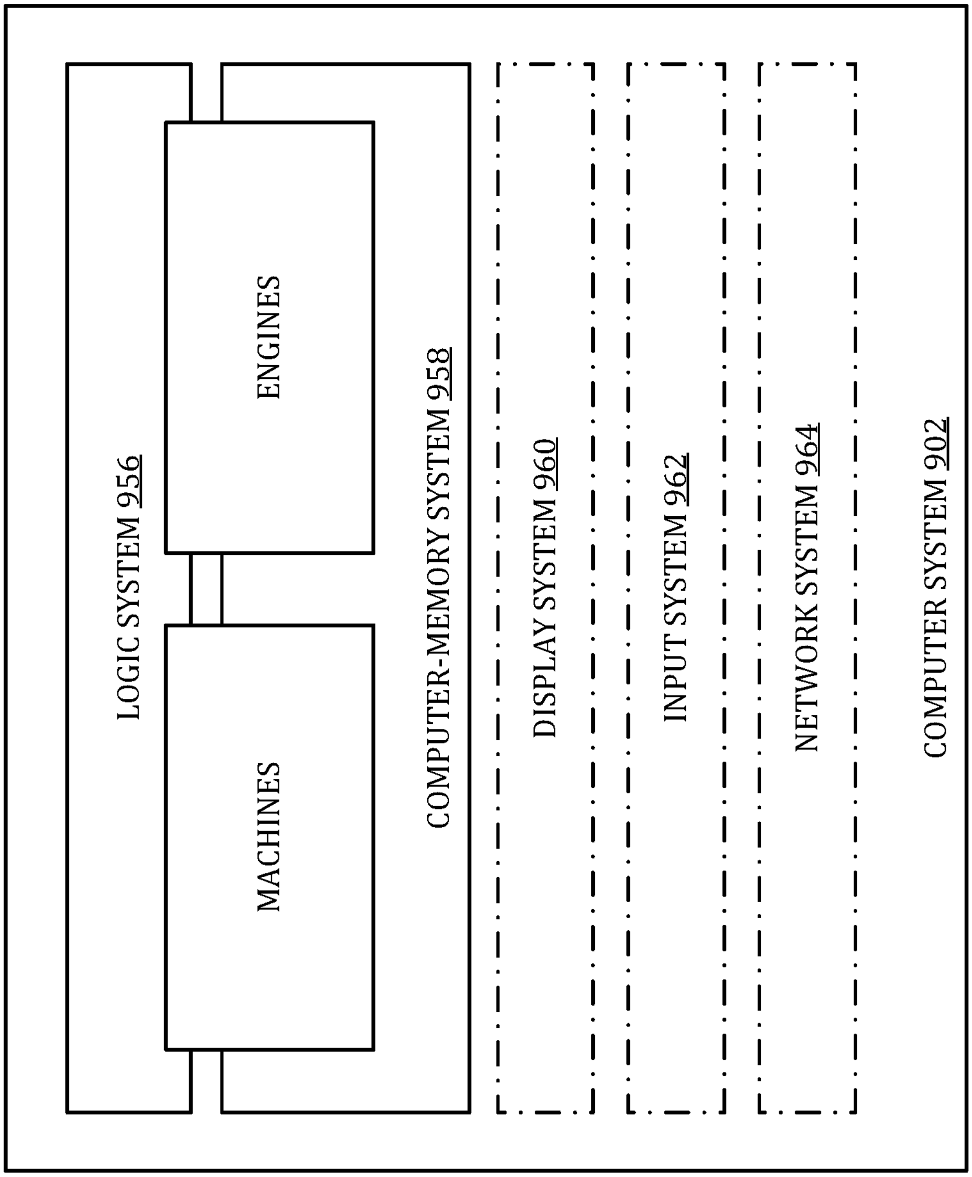
FIG. 9 shows additional aspects of another example computer system.

FIG. 9 provides a schematic representation of a computer system 902 configured to provide some or all of the controller, encoder, and decoder functionality disclosed herein. Computer system 902 may take the form of a personal computer, application-server computer, or any other computing device.

Computer system 902 includes a logic system 956 and a computer-memory system 958. Computer system 902 may optionally include a display system 960, an input system 962, a network system 964, and/or other systems not shown in the drawings.

Logic system 956 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 958 includes at least one physical device configured to temporarily and/or permanently hold computer system information, such as data and instructions executable by logic system 956. When the computer-memory system includes two or more devices, the devices may be collocated or remotely located. Computer-memory system 958 may include at least one volatile, nonvolatile, dynamic, static, read/write, read-only, random-access, sequential-access, location-read addressable, file-read addressable, and/or content-read addressable computer-memory device. Computer-memory system 958 may include at least one removable and/or built-in computer-memory device. When the logic system executes instructions, the state of computer-memory system 958 may be transformed—e.g., to hold different data.

Aspects of logic system 956 and computer-memory system 958 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 956 and computer-memory system 958 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines (as used throughout the above description) may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 960 may be used to present a visual representation of data held by computer-memory system 958. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 962 may comprise or interface with one or more input devices. An input device may include a sensor device or a user input device. Examples of user input devices include a keyboard, mouse, or touch screen.

When included, network system 964 may be configured to communicatively couple computer system 902 with one or more other computer systems. The network system may include wired and/or wireless communication devices compatible with one or more different communication protocols. The network system may be configured for communication via personal-, local- and/or wide-area networks.

This disclosure is presented by way of example and with reference to the attached drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

In conclusion, one aspect of this disclosure is directed to a method for operating a computer system. The method comprises (a) transmitting first and second signals between a device interface and a first device over an elongate conductor, the second signal including content of higher frequency relative to the first signal; and (b) exposing at least the second signal to a second device distinct from the first device, the first device being substantially non-responsive to the second signal.

In some implementations the first and second signals are control signals, the device interface is a device controller, and the first and second signals are transmitted from the device interface to the first device. In some implementations at least one of the first or second signal is a sensory signal, and the sensory signal is transmitted from the first device to the device interface. In some implementations the method further comprises filtering and/or demultiplexing the second signal. In some implementations the first and second signals are transmitted bidirectionally.

Another aspect of this disclosure is directed to a computer system comprising an elongate conductor, a device interface, and a first device. The device interface is coupled to the elongate conductor and configured to: (i) transmit or receive a first signal over the elongate conductor, and (ii) transmit or receive a second signal over the elongate conductor, the second signal including content of higher frequency relative to the first signal. The first device is coupled to the elongate conductor and configured to expose at least the second signal to a second device distinct from the first device, the first device being substantially non-responsive to the second signal.

In some implementations the elongate conductor comprises a flexible conductive film printed or otherwise applied on a flexible dielectric film. In some implementations the device interface comprises at least one general-purpose input-output (GPIO) microcontroller interface. In some implementations the computer system further comprises an exposure component configured to pass at least the second signal between the first device and the second device. In some implementations the exposure component is coupled to the first device or to the second device. In some implementations the exposure component includes a shift register. In some implementations the computer system further comprises at least one interdevice conductor coupled to the exposure component and to at least one of the first or second device. In some implementations the second signal corresponds to a serial protocol. In some implementations the second signal corresponds to a WS281x protocol.

Another aspect of this disclosure is directed to a computer system comprising an elongate conductor, a fan controller, and a fan device. The fan controller is coupled to the elongate conductor and configured to: (i) transmit a fan-control signal over the elongate conductor, and (ii) transmit a lighting-control signal over the elongate conductor, the lighting-control signal including content of higher frequency relative to the fan-control signal. The fan device is coupled to the elongate conductor and configured to expose at least the lighting-control signal to a lighting device distinct from the fan device, the fan device being substantially non-responsive to the fan-control signal.

In some implementations the lighting device is responsive to the higher-frequency content of the lighting-control signal. In some implementations the lighting device comprises one or more polychromatic lamps comprising a plurality of light-emitting diodes. In some implementations the lighting-control signal is a multiplexed, digital signal, which is demultiplexed and converted to analog form to drive each of the plurality of light-emitting diodes. In some implementations the fan device is proximate to the lighting device. In some implementations the fan-control signal is a pulse-width modulated signal configured to influence a rotation speed of a fan rotor of the fan device.

Another aspect of this disclosure is directed to a computer system comprising an elongate first conductor, a fan controller, a fan device, and a lighting device distinct from the fan device. The fan controller is coupled to the elongate first conductor and configured to: (i) transmit a fan-control signal over the elongate first conductor, (ii) transmit a lighting-control signal over the elongate first conductor, the lighting-control signal including content of higher frequency than the fan-control signal, and (iii) transmit a lighting-clock signal over the elongate second conductor for synchronizing the lighting-control signal the lighting-control signal. The fan device coupled is to the elongate first and second conductors and is substantially non-responsive to the lighting-control signal and to the lighting-clock signal. At least the lighting-control signal and the lighting-clock signal are exposed to the lighting device, and at least the first or second elongate conductor conducts bidirectionally between the fan controller and the fan device.

In some implementations the fan device includes a sensor that transmits, along the second conductor, a waveform that varies according to a rotation speed of a rotor of the fan device, and the waveform is received in the fan controller. In some implementations the fan controller is configured to recognize a resting state of the waveform and periodically and momentarily drive the second conductor out of the resting state. In some implementations the second conductor is driven out of the resting state during a sub-period which is short relative to a pulse-width of the waveform. In some implementations the fan device is configured to drive the second conductor via an open-drain or open-collector circuit, such that a resting state of the waveform is a high-impedance state readily overcome by drive logic of the fan controller. In some implementations the lighting-control signal is synchronized according to the lighting-clock signal.

Another aspect of this disclosure is directed to a method for operating a computer system. The method comprises (a) transmitting first and second signals between a device interface and a first device over an elongate first conductor, the second signal including content of higher frequency than the first signal; (b) transmitting a timing signal over an elongate second conductor, between a device interface and the first device, for synchronizing the second signal; and (c) exposing at least the second signal and the timing signal to a second device distinct from the first device, the first device being substantially non-responsive to the second signal and to the timing signal. At least the first or second elongate conductor conducts bidirectionally between the device interface and the first device.

In some implementations the first and second signals are control signals, the device interface is a device controller, and the first and second signals are transmitted from the device interface to the first device. In some implementations only the second elongate conductor that conducts the timing signal conducts bidirectionally.

Another aspect of this disclosure is directed to a computer system comprising an elongate first conductor, a device interface, and first and second devices. The device interface is coupled to the elongate first conductor and configured to: (i) transmit or receive a first signal over the elongate first conductor, (ii) transmit or receive a second signal over the elongate first conductor, the second signal including content of higher frequency than the first signal, and (iii) transmit or receive a timing signal over an elongate second conductor, between a device interface and the first device, for synchronizing the second signal. The first device is coupled to the elongate first and second conductors and is substantially non-responsive to the second signal and to the timing signal. Distinct from the first device, the second device is configured to be exposed to at least the second signal and the timing signal. At least the first or second elongate conductor conducts bidirectionally between the device interface and the first device.

In some implementations the second conductor carries another signal besides the timing signal between the device interface and the first device. In some implementations both the first conductor and the second conductor are overloaded by addition of intermittent bursts of a two-wire communication protocol, and the two-wire communication protocol comprises the second signal and the timing signal. In some implementations the computer system further comprises an exposure component configured to pass at least the second signal between the first device and the second device. In some implementations the exposure component is coupled to the first device or to the second device. In some implementations the exposure component includes a shift register. In some implementations the computer system further comprises at least two interdevice conductors coupled to the exposure component and to at least one of the first or second device. In some implementations the first and second conductors are arranged in a microbus. In some implementations the microbus comprises flexible conductive film printed or otherwise applied on a flexible dielectric film. In some implementations the two-wire protocol comprises an I2C protocol. In some implementations the two-wire protocol comprises an serial peripheral interface protocol.

It will be understood that the configurations and/or approaches described herein are exemplary and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed. In that spirit, the phrase 'based at least partly on' is intended to remind the reader that the functional and/or conditional logic illustrated herein neither requires nor excludes suitable additional logic, executing in combination with the illustrated logic, to provide additional benefits.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computer system comprising:
- an elongate first conductor;
- a fan controller coupled to the elongate first conductor and configured to:
  - (i) transmit a fan-control signal over the elongate first conductor, and
  - (ii) transmit a lighting-control signal over the elongate first conductor, the lighting-control signal including content of higher frequency than the fan-control signal, and
  - (iii) transmit a lighting-clock signal over an elongate second conductor for synchronizing the lighting-control signal;
- a fan device coupled to the elongate first and second conductors, such that the fan device receives the fan-control signal, the lighting-control signal, and the lighting-clock signal, the fan device being substantially non-responsive to the lighting-control signal and to the lighting-clock signal; and
- a lighting device distinct from the fan device,
- wherein at least the lighting-control signal and the lighting-clock signal are exposed to the lighting device, and wherein at least the first or second elongate conductor conducts bidirectionally between the fan controller and the fan device.

2. The computer system of claim 1 wherein the fan device includes a sensor that transmits, along the second conductor, a waveform that varies according to a rotation speed of a rotor of the fan device, and wherein the waveform is received in the fan controller.

3. The computer system of claim 2 wherein the fan controller is configured to recognize a resting state of the waveform and periodically and momentarily drive the second conductor out of the resting state.

4. The computer system of claim 3 wherein the second conductor is driven out of the resting state during a sub-period which is short relative to a pulse-width of the waveform.

5. The computer system of claim 2 wherein the fan device is configured to drive the second conductor via an open-drain or open-collector circuit, such that a resting state of the waveform is a high-impedance state readily overcome by drive logic of the fan controller.

6. The computer system of claim 1 wherein the lighting-control signal is synchronized according to the lighting-clock signal.

7. A method for operating a computer system, the method comprising:

transmitting first and second signals between a device interface and a fan device over an elongate first conductor, the second signal including content of higher frequency than the first signal;

transmitting a timing signal over an elongate second conductor, between a device interface and the fan device, for synchronizing the second signal, such that the fan device receives the first signal, the second signal, and the timing signal; and exposing at least the second signal and the timing signal to a second device distinct from the fan device, the fan device being substantially non-responsive to the second signal and to the timing signal, wherein at least the first or second elongate conductor conducts bidirectionally between the device interface and the fan device.

8. The method of claim 7 wherein the first and second signals are control signals, wherein the device interface is a device controller, and wherein the first and second signals are transmitted from the device interface to the fan device.

9. The method of claim 7 wherein only the second elongate conductor that conducts the timing signal conducts bidirectionally.

10. A computer system comprising:

an elongate first conductor;

a device interface coupled to the elongate first conductor and configured to:

(i) transmit or receive a first signal over the elongate first conductor, and (ii) transmit or receive a second signal over the elongate first conductor, the second signal including content of higher frequency than the first signal, and (iii) transmit or receive a timing signal over an elongate second conductor, between a device interface and a fan device, for synchronizing the second signal; and the fan device coupled to the elongate first and second conductors, such that the fan device receives the first signal, the second signal, and the timing signal, the fan device being substantially non-responsive to the second signal and to the timing signal;

a second device distinct from the fan device configured to be exposed to at least the second signal and the timing signal, wherein at least the first or second elongate conductor conducts bidirectionally between the device interface and the fan device.

11. The computer system of claim 10 wherein the second conductor carries another signal besides the timing signal between the device interface and the fan device.

12. The computer system of claim 10 wherein both the first conductor and the second conductor are overloaded by addition of intermittent bursts of a two-wire communication protocol, and wherein the two-wire communication protocol comprises the second signal and the timing signal.

13. The computer system of claim 10 further comprising an exposure component configured to pass at least the second signal between the fan device and the second device.

14. The computer system of claim 10 wherein the exposure component is coupled to the fan device or to the second device.

15. The computer system of claim 10 wherein the exposure component includes a shift register.

16. The computer system of claim 15 further comprising at least two interdevice conductors coupled to the exposure component and to at least one of the first fan device or second device.

17. The computer system of claim 10 wherein the first and second conductors are arranged in a microbus.

18. The computer system of claim 10 wherein the microbus comprises flexible conductive film printed or otherwise applied on a flexible dielectric film.

19. The computer system of claim 2 wherein the two-wire communication protocol comprises an I2C protocol.

20. The computer system of claim 2 wherein the two-wire communication protocol comprises a serial peripheral interface protocol.

* * * * *